US009246069B2

(12) United States Patent
Furuyama et al.

(10) Patent No.: US 9,246,069 B2
(45) Date of Patent: Jan. 26, 2016

(54) SEMICONDUCTOR LIGHT EMITTING DEVICE

(71) Applicant: KABUSHIKI KAISHA TOSHIBA, Tokyo (JP)

(72) Inventors: Hideto Furuyama, Yokohama Kanagawa (JP); Yosuke Akimoto, Yokohama Kanagawa (JP); Miyoko Shimada, Yokohama Kanagawa (JP); Akihiro Kojima, Yokohama Kanagawa (JP); Yoshiaki Sugizaki, Fujisawa Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/492,935

(22) Filed: Sep. 22, 2014

(65) Prior Publication Data

US 2015/0008470 A1   Jan. 8, 2015

Related U.S. Application Data

(63) Continuation of application No. 13/598,393, filed on Aug. 29, 2012, now Pat. No. 8,872,210.

(30) Foreign Application Priority Data

Apr. 27, 2012   (JP) ................ 2012-103040

(51) Int. Cl.
*H01L 33/50* (2010.01)
*H01L 33/52* (2010.01)
(Continued)

(52) U.S. Cl.
CPC .............. *H01L 33/504* (2013.01); *H01L 24/97* (2013.01); *H01L 33/501* (2013.01); *H01L 33/52* (2013.01);
(Continued)

(58) Field of Classification Search
CPC ......... H01L 21/50; H01L 33/00; H01L 33/52; H01L 33/60; H01L 33/62; H01L 33/501; H01L 33/504; H01L 33/50
See application file for complete search history.

(56) References Cited

U.S. PATENT DOCUMENTS

| 6,870,311 B2 | 3/2005 | Mueller et al. |
| 7,045,956 B2 | 5/2006 | Braune et al. |

(Continued)

FOREIGN PATENT DOCUMENTS

| EP | 2113949 A2 | 11/2009 |
| JP | 2007053170 A | 3/2007 |

(Continued)

OTHER PUBLICATIONS

Taiwan Office Action dated Jan. 12, 2015, filed in Taiwanese counterpart Application No. 101147848, 13 pages (with translation).
(Continued)

*Primary Examiner* — Tan N Tran
*Assistant Examiner* — Fazli Erdem
(74) *Attorney, Agent, or Firm* — Patterson & Sheridan, LLP

(57) ABSTRACT

According to one embodiment, a semiconductor light emitting device includes a light emitting element, a phosphor layer, and a fluorescent reflection film. The phosphor layer has a transparent medium, a phosphor dispersed in the transparent medium, and a particle dispersed in the transparent medium. The phosphor is excited by the excitation light so as to emit a fluorescence. The particle is a magnitude of not more than $1/10$ a wavelength of the excitation light. The particle has a different refractive index from a refractive index of the transparent medium. The fluorescent reflection film is provided between the light emitting element and the phosphor layer. The fluorescent reflection film has a higher reflectance with respect to a fluorescent wavelength of the phosphor, than a reflectance with respect to the wavelength of the excitation lights.

20 Claims, 21 Drawing Sheets

(51) Int. Cl.
  H01L 33/60 (2010.01)
  H01L 33/62 (2010.01)
  H01L 23/00 (2006.01)
  H01L 33/46 (2010.01)

(52) U.S. Cl.
  CPC ............... H01L 33/60 (2013.01); H01L 33/62 (2013.01); *H01L 33/46* (2013.01); *H01L 2933/0091* (2013.01)

(56) References Cited

U.S. PATENT DOCUMENTS

| | | | |
|---|---|---|---|
| 8,110,421 | B2 | 2/2012 | Sugizaki et al. |
| 2007/0041191 | A1 | 2/2007 | Okada |
| 2008/0297047 | A1 | 12/2008 | Kohno et al. |
| 2009/0050911 | A1 | 2/2009 | Chakraborty |
| 2009/0147497 | A1* | 6/2009 | Nada ............................. 362/84 |
| 2009/0272996 | A1 | 11/2009 | Chakraborty |
| 2010/0038665 | A1 | 2/2010 | Sugiura et al. |
| 2010/0148198 | A1* | 6/2010 | Sugizaki et al. ............. 257/98 |
| 2010/0176410 | A1* | 7/2010 | Furuyama ..................... 257/98 |
| 2011/0147778 | A1* | 6/2011 | Ichikawa ....................... 257/98 |
| 2011/0260184 | A1* | 10/2011 | Furuyama ..................... 257/98 |
| 2011/0297969 | A1 | 12/2011 | Kojima et al. |
| 2011/0297987 | A1 | 12/2011 | Koizumi et al. |
| 2012/0032211 | A1 | 2/2012 | Schindler et al. |
| 2013/0316478 | A1 | 11/2013 | Ichikawa |
| 2014/0151739 | A1 | 6/2014 | Koizumi et al. |

FOREIGN PATENT DOCUMENTS

| | | |
|---|---|---|
| JP | 2009065199 A | 3/2009 |
| JP | 2009179662 A | 8/2009 |
| JP | 2011071404 A | 4/2011 |
| JP | 2011129661 A | 6/2011 |
| JP | 2011233650 A | 11/2011 |
| JP | 2011254033 A | 12/2011 |
| JP | 2011258675 A | 12/2011 |
| TW | 200940905 A | 10/2009 |
| TW | 201031033 A | 8/2010 |
| TW | 201201426 A | 1/2012 |
| WO | 03093393 A1 | 11/2003 |

OTHER PUBLICATIONS

Taiwanese Office Action dated Apr. 28, 2015, filed in Taiwanese counterpart Application No. 101147848, 13 pages (with translation).
European Search Report dated Jul. 7, 2015, mailed in European counterpart Application No. 12182369.4, 7 pages.
Japanese Office Action dated Jul. 3, 2015, filed in Japanese counterpart Application No. 2012-103040, 4 pages (with translation).
Japanese Office Action dated Oct. 7, 2015, filed in Japanese counterpart Application No. 2012-103040, 4 pages. (with translation).

\* cited by examiner

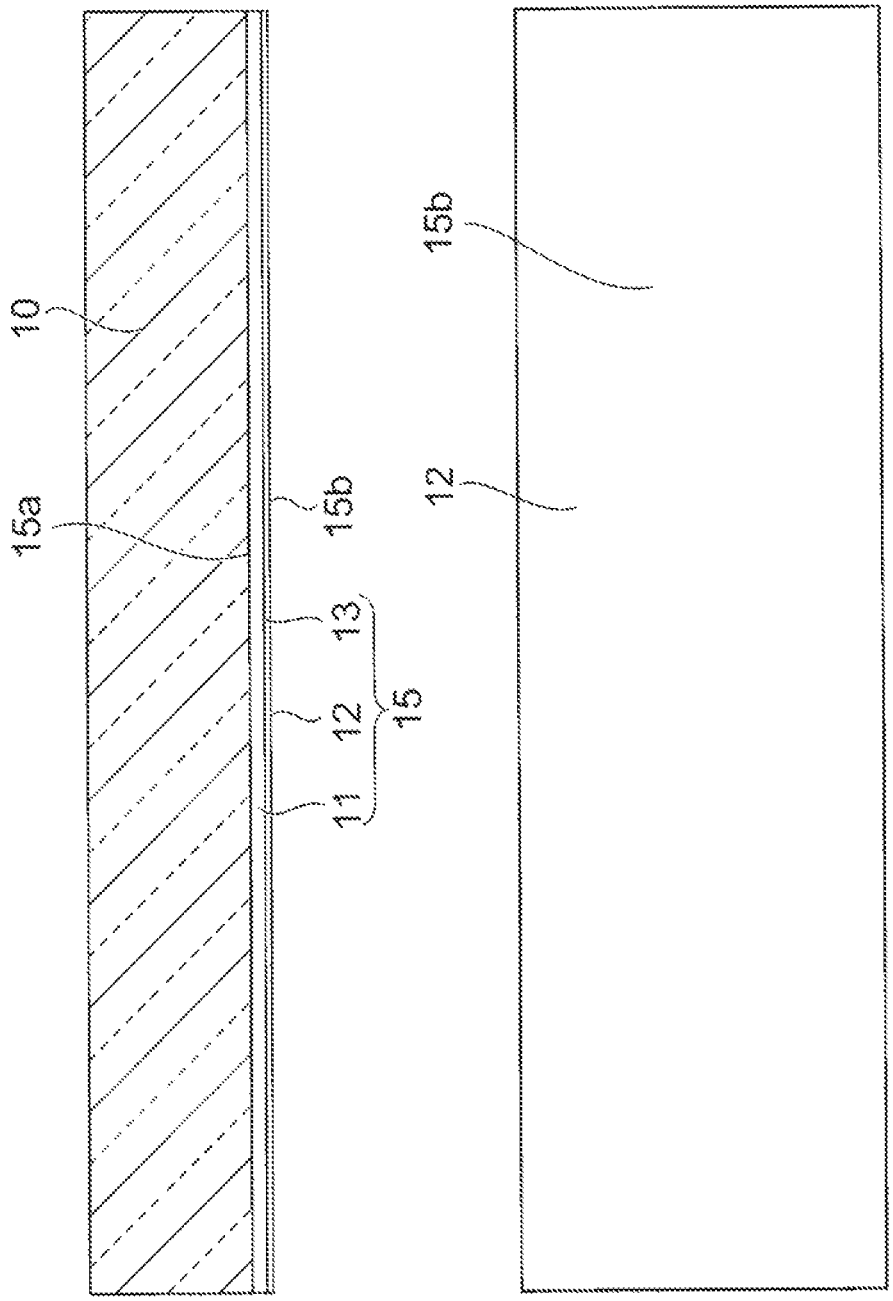

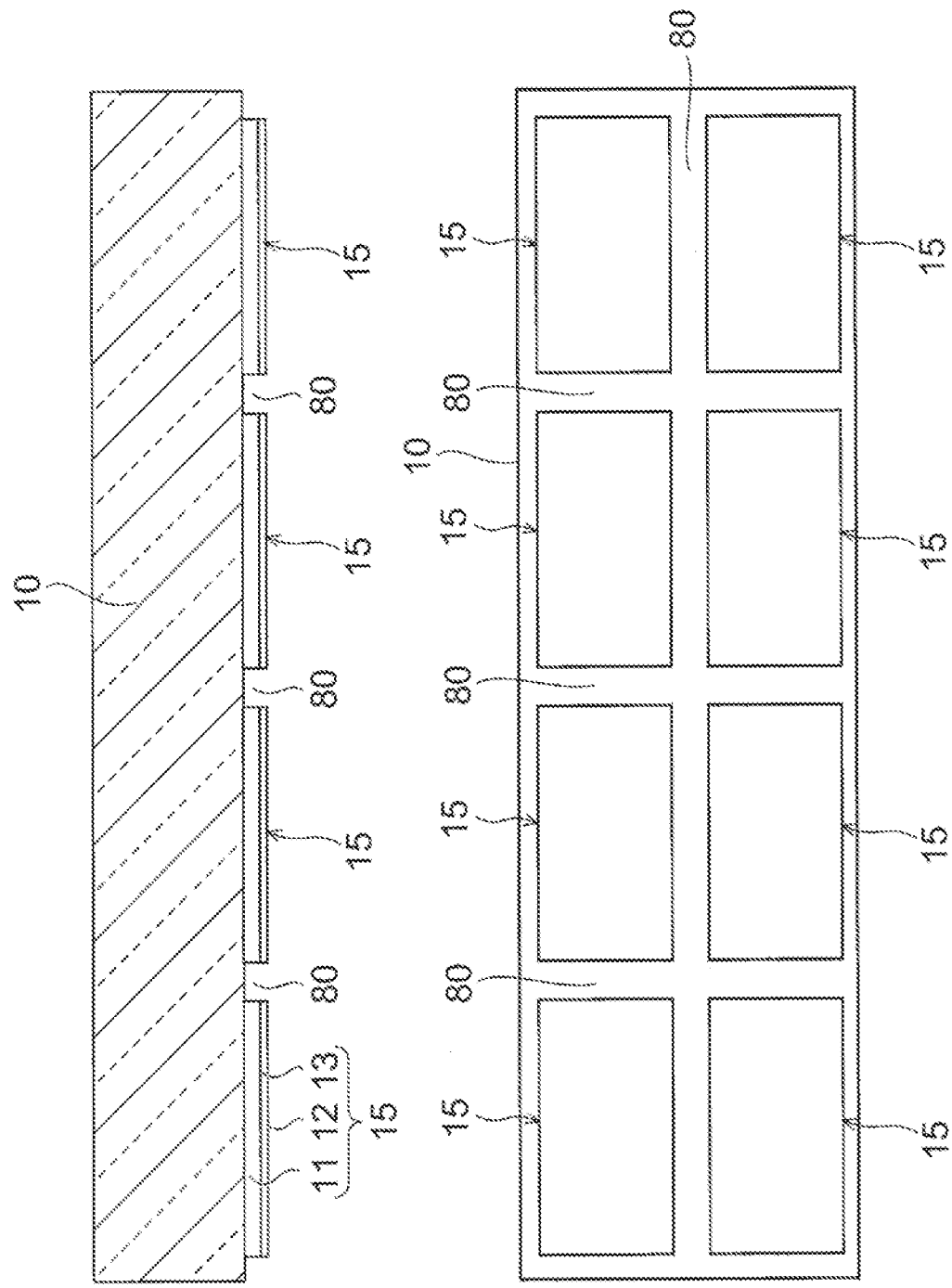

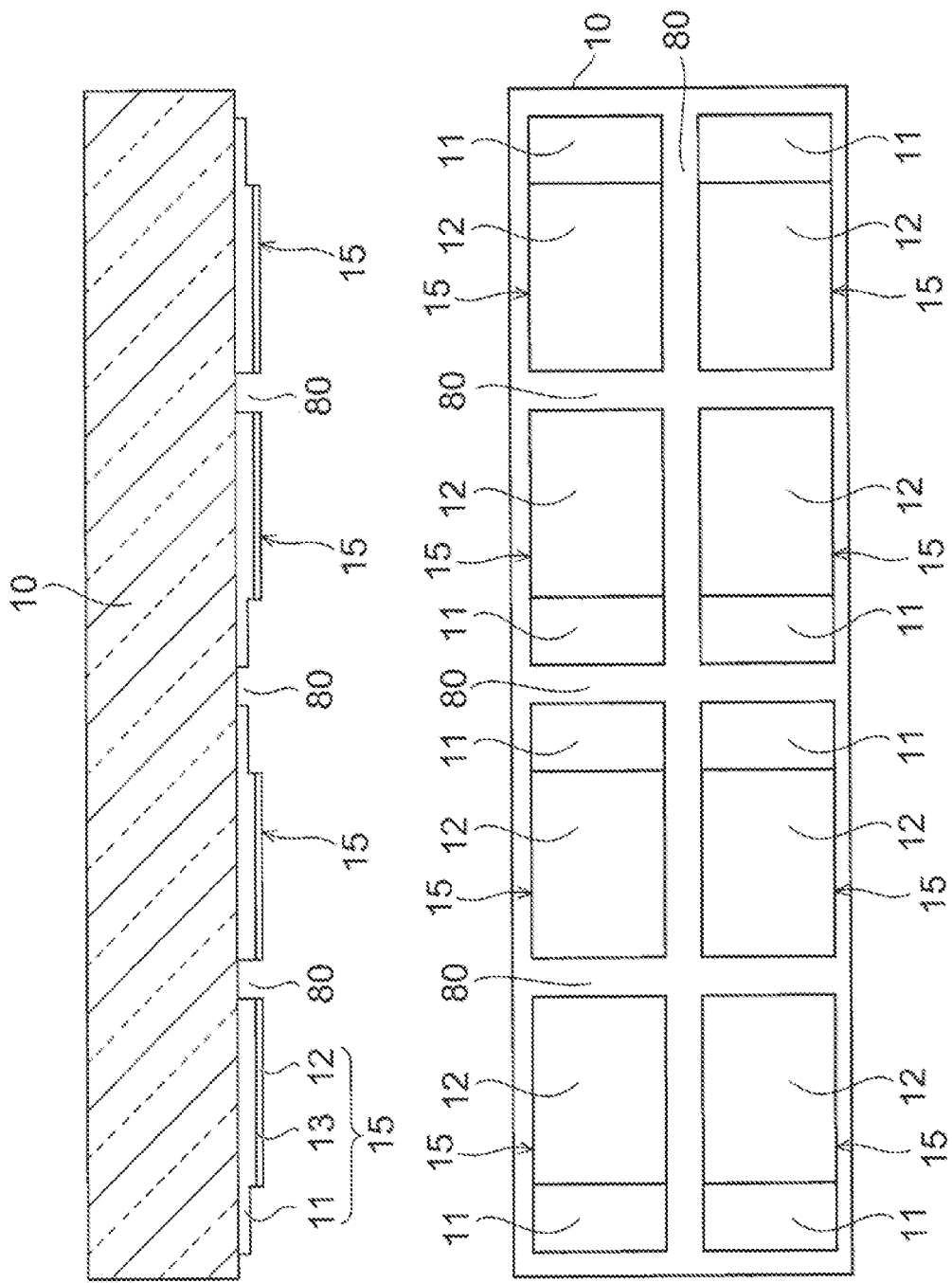

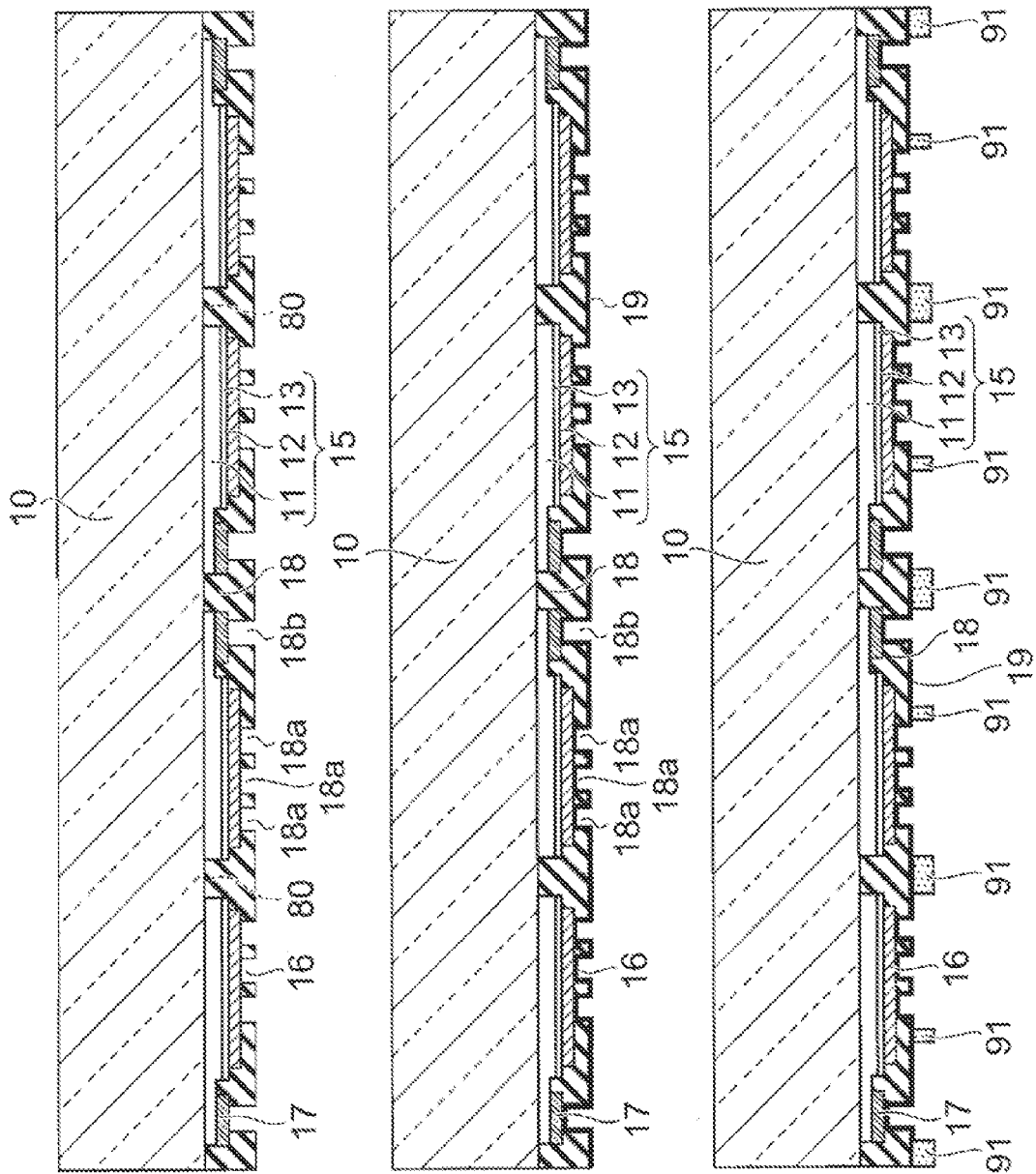

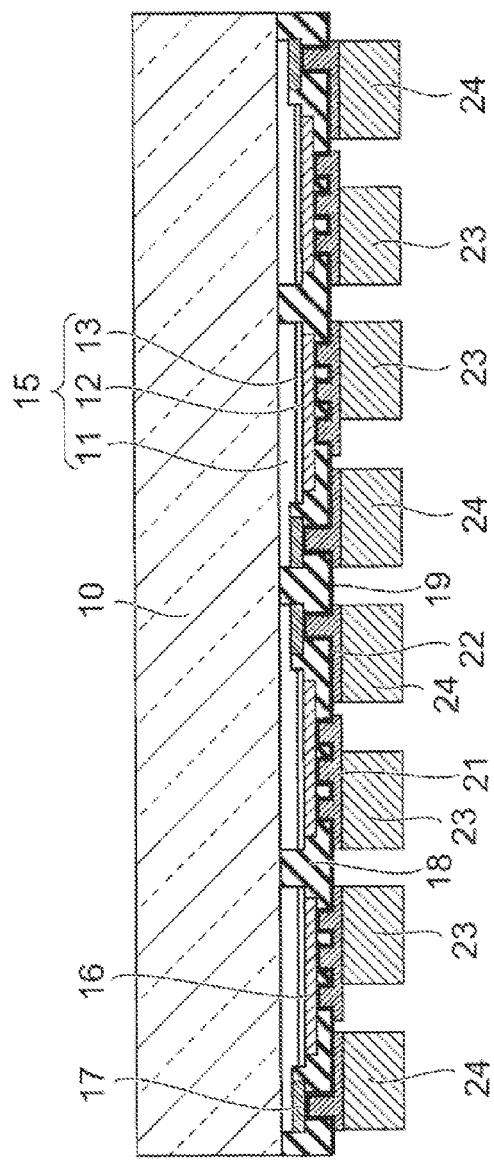
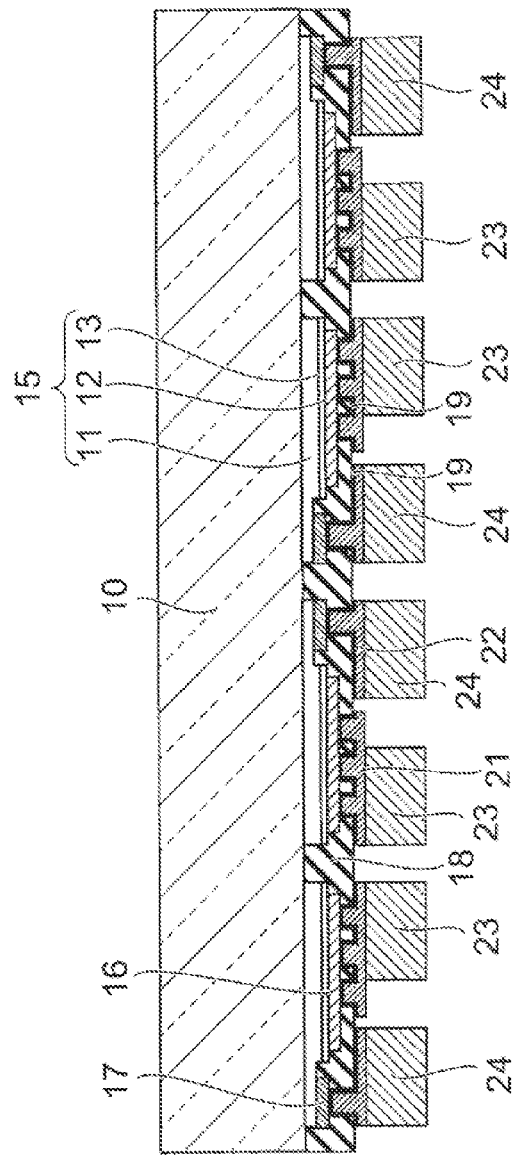
FIG. 15A
FIG. 15B

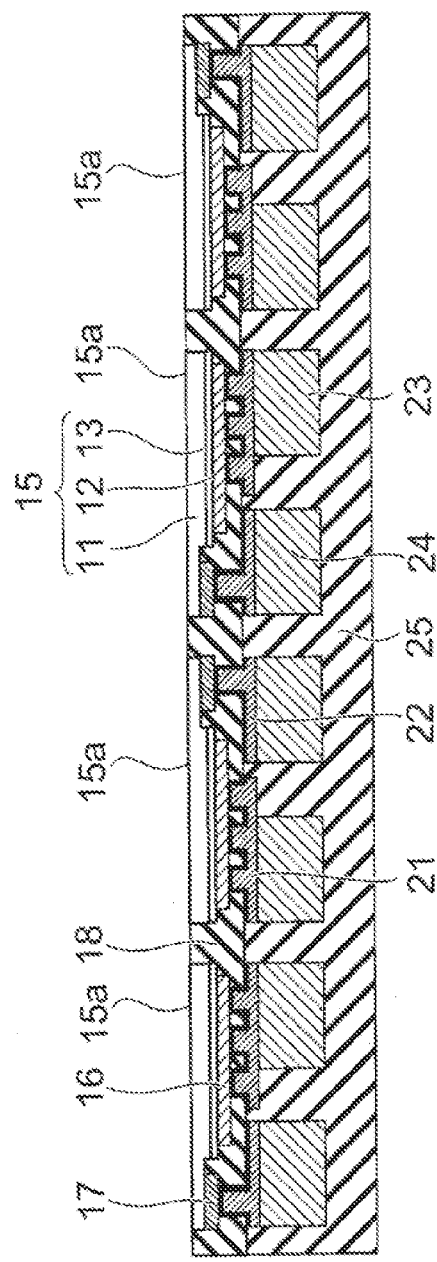
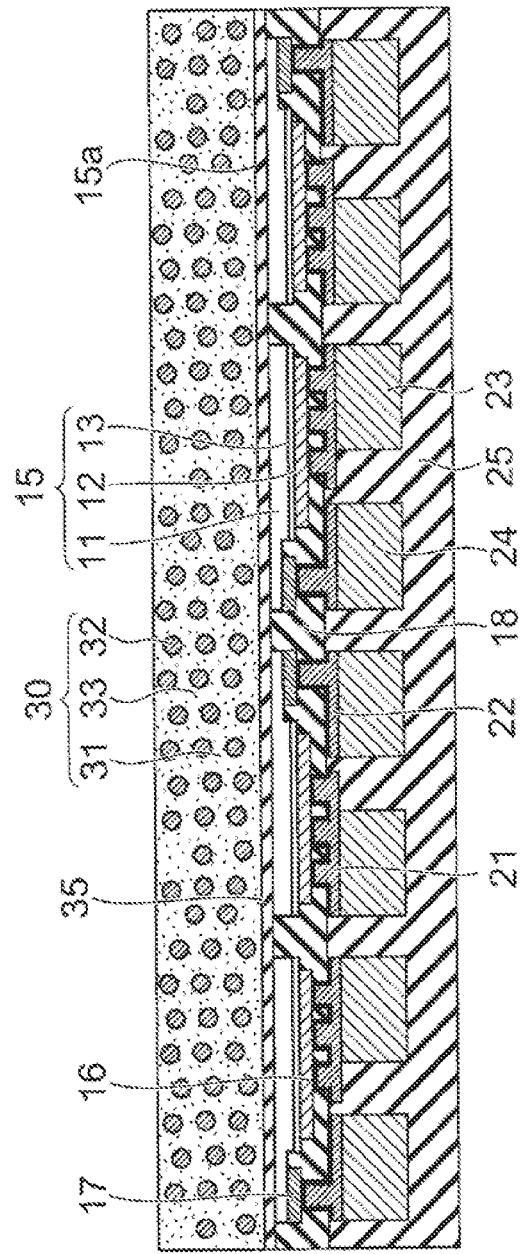
FIG. 17A
FIG. 17B

US 9,246,069 B2

SEMICONDUCTOR LIGHT EMITTING DEVICE

CROSS-REFERENCE TO RELATED APPLICATION

This application is a continuation of U.S. patent application Ser. No. 13/598,393, filed on Aug. 29, 2012, which is based upon and claims the benefit of priority from Japanese Patent Application No. 2012-103040, filed on Apr. 27, 2012, the entire contents of each of which are incorporated herein by reference.

FIELD

Embodiments described herein relate generally to a semiconductor light emitting device.

BACKGROUND

A semiconductor light emitting element which causes a direct transition-type semiconductor to carry out a recombination light emitting by injecting carriers on the basis of a p-n junction has attracted attention as a next-generation illumination light source. It is basically required that the light emitting semiconductor device for lighting emit a white light which is close to sunlight. As the semiconductor white light source, there are a three primary colors (RGB) element array, a quasi-white light source on the basis of color-mixing of a blue light emitted from a light emitting element and a yellow light emitted from a phosphor, and a three primary color phosphor excitation light source on the basis of an ultraviolet light emitting element and the like.

In the white light source using the phosphor, it is necessary to uniformly carry out a color mixing of a light emitting element output light, a phosphor output light or an output light between multicolor phosphors.

BRIEF DESCRIPTION OF THE DRAWINGS

FIGS. 7A to 18B are schematic views showing a method for manufacturing the light emitting device of the embodiment;

DETAILED DESCRIPTION

Figure 1A:
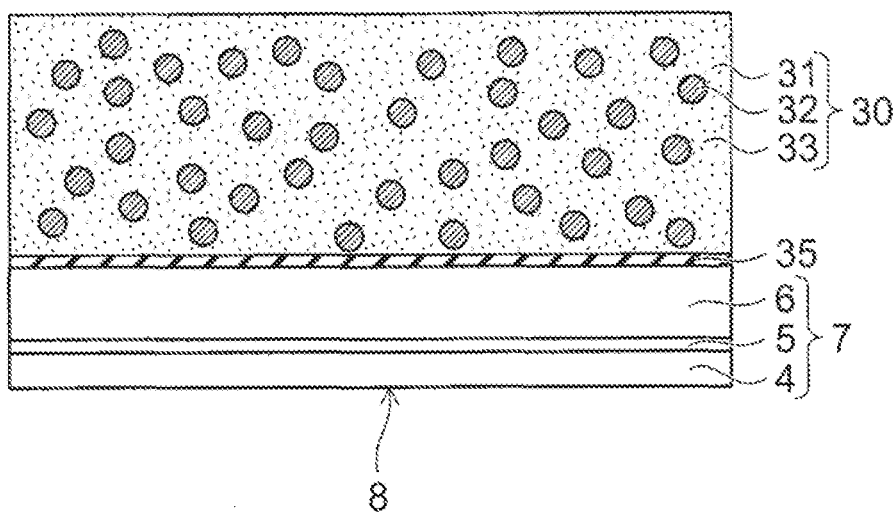
FIGS. 1A and 1B are schematic cross-sectional view of a stacked configuration which includes a light emitting element, a fluorescent reflection film and a phosphor layer, of an embodiment.

According to one embodiment, a semiconductor light emitting device includes a light emitting element, a phosphor layer, and a fluorescent reflection film. The light emitting element emits an excitation light. The phosphor layer is provided on the light emitting element. The phosphor layer has a transparent medium, a phosphor dispersed in the transparent medium, and a particle dispersed in the transparent medium. The phosphor is excited by the excitation light so as to emit a fluorescence. The particle is a magnitude of not more than $\frac{1}{10}$ a wavelength of the excitation light. The particle has a different refractive index from a refractive index of the transparent medium. The fluorescent reflection film is provided between the light emitting element and the phosphor layer. The fluorescent reflection film has a higher reflectance with respect to a fluorescent wavelength of the phosphor, than a reflectance with respect to the wavelength of the excitation light.

A description will be given below of embodiments with reference to the accompanying drawings. In this case, the description is carried out using several specific configurations as examples, however, they can be executed in the same manner as long as the configuration has the same function, and the invention is not limited to the following embodiments. It is noted that the same reference numerals denote the same elements in each of the drawings.

In accordance with the embodiment, a semiconductor light emitting device is provided with a light emitting element which emits an excitation light, a phosphor layer which is provided on the light emitting element, and a fluorescent reflection film which is provided between the light emitting element and the phosphor layer.

FIG. 1A is a schematic cross sectional view of a stacked configuration which includes a light emitting element 8, a fluorescent reflection film 35 and a phosphor layer 30, according to the embodiment.

The light emitting element 8 is, for example, a light emitting diode (LED), and has a semiconductor layer 7 which includes a p-type semiconductor layer 4, an active layer 5 and an n-type semiconductor layer 6. Further, the light emitting element 8 has a contact electrode (not illustrated) with the p-type semiconductor layer 4, and a contact electrode (not illustrated) with the n-type semiconductor layer 6. The active layer 5 sandwiched between the p-type semiconductor layer 4 and the n-type semiconductor layer 6 is a light emitting portion.

A semiconductor (for example, GaN) that has a comparatively wide band gap is employed in the n-type semiconductor layer 6 and the p-type semiconductor layer 4, and a semiconductor (for example, InGaN) that has a comparatively narrow band gap is inserted to the active layer 5. Accordingly, carriers injected in a p-n junction which sandwiches the active layer 5 are effectively confined, thereby luminescence by carrier recombination is effectively carried out, and a high light emitting efficiency can be obtained. The active layer 5 may have a so-called multi quantum well (MQW) configuration. The light emitting element 8 is not limited to a LED, but may be a surface emitting laser diode (SELD).

The phosphor layer has a resin layer 31 which serves as a transparent medium, a plurality or granular phosphors 32 which are excited by an excitation light from the light emitting element 8 as to emit a fluorescence, and a plurality of scattering particles 33. The phosphors 32 and the scattering particles 33 are dispersed into the transparent medium 31.

The resin layer 31 is, for example, a silicone resin or an epoxy resin which is transparent with respect to the excitation light of the light emitting element 8 and the fluorescence of the phosphor 32. The scattering particle 33 has a refractive index which is a magnitude of not more than 1/10 the wavelength of the excitation light of the light emitting element 8 which is different from the refractive index of the resin layer 31.

Various phosphors can be employed for phosphor 32 singly or in combination. For example, a white output light source can be obtained by setting a wavelength of the excitation light (a light emitting wavelength) of the light emitting element 8 to 450 nm and by using a yellow phosphor such as $Y_3Al_5O_{12}$ (YAG): Ce, $Tb_{3-x}RE_xO_{12}$; Ce (TAG) (RE=Y, Gd, La, Lu), $Sr_{2-x-y}Ba_xCa_ySiO_4$: Eu or the like.

Further, a white light source having a high color rendering can be obtained by setting the wavelength of the excitation light of the light emitting element 8 to 450 nm and by using a combination of a red phosphor such as YAG: Nb, $Sr_xCa_{1-x}S$: Eu, $CaSiAlN_3$: Eu, $Sr_{2-y}Ca_ySiO_4$: Eu or the like, and a green phosphor such as $SrGa_2S_4$: Eu, $Sr_{2-y}Ba_ySiO_4$: Eu, $SrSi_2O_2N_2$: Eu or the like.

The scattering powder 33 is a material having a refractive index different from that of the resin layer 31, for example, $TiO_2$, $SiO_2$, $Si_3N_4$, $ZrO_2$, SiC, $Al_2O_3$, $TaO_5$, BN, a hollow silica, a micro bubble (an air bubble) or the like, a grain size (a grain diameter) thereof is not more than 1/10 the wavelength of the excitation light of the light emitting element 8. For example, in the case in which the wavelength of the excitation light of the light emitting element 8 is 450 nm, the grain diameter of the scattering particle 33 is set to be not more than 45 nm.

Further, if the refractive index of the resin layer 31 is set to n, and the wavelength of the excitation light of the light emitting element 8 is set to λ, it becomes possible to enhance a wavelength selectivity of a light scattering effect mentioned later, by setting the grain diameter of the scattering particle 33 to 1/10 the wavelength within a medium (λ/n) of the resin layer 31. For example, in the case that the wavelength of the excitation light of the light emitting element 8 is 450 nm, and the refractive index of the resin layer 31 is 1.5, it is desirable that the grain diameter of the scattering particle 33 be not more than 30 nm.

Since the scattering particle 33 has the grain diameter which is not more than 1/10 the wavelength of the excitation light, a Rayleigh scattering of the excitation light arises in the resin layer 31, causing scattering mainly in a traveling direction of the excitation light and an inverse direction thereof.

Since the Rayleigh scattering is in inverse proportion to a biquadrate of the wavelength of scattering, a scattering intensity becomes weaker as the wavelength of the light becomes longer, that is, the scattering is a light scattering that has a wavelength dependency, and in combination of the phosphors, the scattering arises less in the output light (fluorescence) of the phosphor 32, as the wavelength becomes longer, with respect to the scattering of the excitation light (the wavelength 450 nm).

Figure 2A:
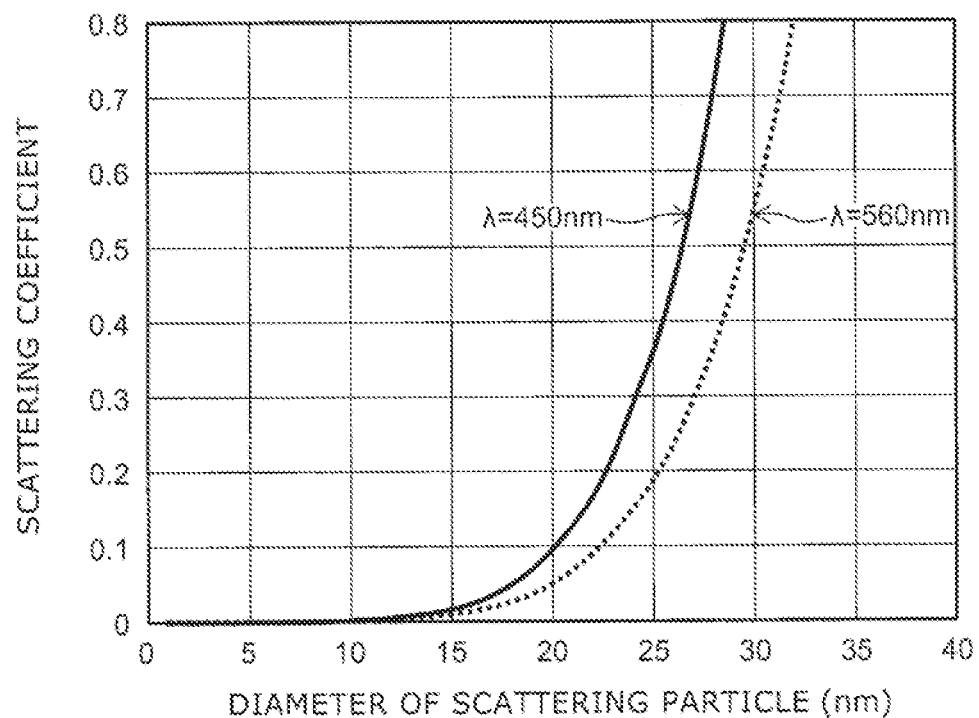
FIG. 2A is a light scatter characteristic graph of scattered particle of the embodiment.

For example, if the wavelength of the excitation light of the light emitting element 8 is set to 450 nm (blue), and the wavelength of the fluorescence of the phosphor 32 is set to 560 nm (yellow), the intensity of the Rayleigh scattering varies twice or more between these two wavelengths, as shown in FIG. 2A.

Figure 2B:
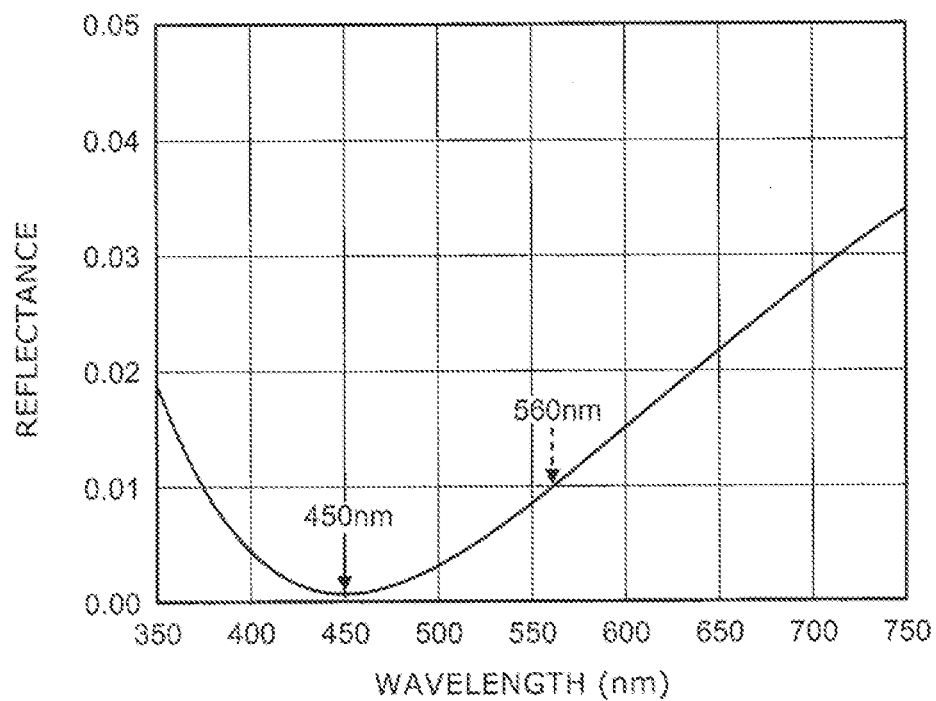
FIG. 2B is a characteristic graph of the fluorescent reflection film of the embodiment.

In this case, since the Rayleigh scattering is in proportion to a sextuplicate of the grain diameter of the scattering particle 33, the scattering hardly arises if the grain diameter is too small as is understood from FIGS. 2A and 2B. Accordingly, as is understood from FIGS. 2A and 2B, it is desirable that the grain diameter of the scattering particle 33 be not less than 15 nm, and it is desirable that the maximum grain diameter is made not more than 45 nm in which the wavelength of the excitation light of the light emitting element 8 is in a Rayleigh scattering region.

Accordingly, it becomes possible to create a state in which the blue light having the wavelength 450 nm is easily scattered, and the yellow light having the wavelength 560 nm is hard to be scattered, and it becomes possible to adjust a difference of a light emitting brightness distribution with respect to a light output angle between the excitation light of the light emitting element and the output light of the phosphor, by more selectively scattering excitation light of the light emitting element 8.

Further, it becomes possible to dissolve an uneven excitation of the phosphor 32 in which the exciting intensity of the phosphor 32 in a closer side to the light emitting element 8 is strong, and the exciting intensity of the phosphor 32 in a far side from the light emitting element 8 becomes weaker as a reaching amount of the excitation light is reduced, by scattering selectively more excitation light, whereby it becomes possible to prevent a reduction of a total phosphor light emitting efficiency caused by an excitation saturation of the phosphor 32 in the closer side to the light emitting element 8.

In other words, the excitation light to the phosphor 32 in the closer side to the light emitting element 8 is scattered by the scattering particle 33, thereby preventing the light from being locally strongly excited. Since both the phosphor 32 in the far side from the light emitting element 8 and each of back faces of the phosphors 32 (a face on a side facing a face opposed to the light emitting element 8) are excited by the scattering light of the excitation light, an irradiation of the excitation light to the phosphor 32 becomes more uniform by a reduced deflection of the spatial position and direction.

Therefore, it becomes possible that the phosphor 32 is partly strongly excited to saturate an output, are that a reabsorbed light loss by a weak excited phosphor is suppressed by reducing the weak excited portion of the phosphor 32 by the uniformization of the exciting strength of the phosphor 32.

Therefore, in accordance with the embodiment, it becomes possible that the exciting strength of the phosphor is uniformized, the output saturation of the phosphor 32 and the reabsorbed loss of the weak excited phosphor caused by the uneven excitation are suppressed, and an output efficiency of the phosphor 32 is improved.

In this case, a description will be given below of an effect obtained by scattering selectively more excitation light by the scattering particle 33 with FIG. 3A to FIG. 5D.

Figure 3A:
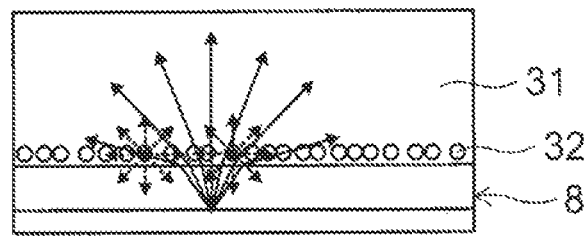
FIG. 3A is a schematic cross-sectional view of the light emitting element and the phosphor layer of a first comparative example.

Each of FIG. 3A to FIG. 5D is a view which schematically shows a light radiation condition of the light emitting element 8 and the phosphor 32. FIG. 3A shows a first comparative example in which the phosphors 32 precipitate on the light emitting element 8 so as to be in close formation. FIG. 4 shows a second comparative example in which the phosphor 32 is dispersed into the resin layer 31 and the scattering particle is not included in the resin layer 31. FIG. 5A shows the embodiment mentioned above in which the phosphor 32 is dispersed into the resin layer 31 and the scattering particle 33 is dispersed into the resin layer 31.

Figure 3B:
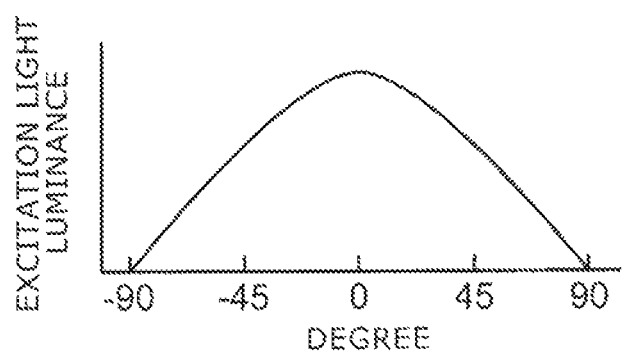
FIG. 3B is a distribution of excitation light brightness in the first comparative example.
Figure 3C:
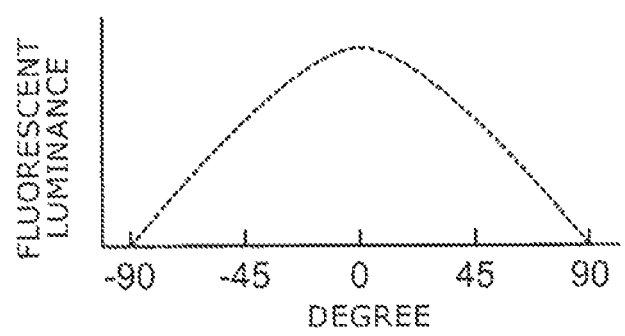
FIG. 3C is a distribution of fluorescent brightness in the first comparative example, FIG. 3D a distribution of chromaticity in the first comparative example.
Figure 3D:
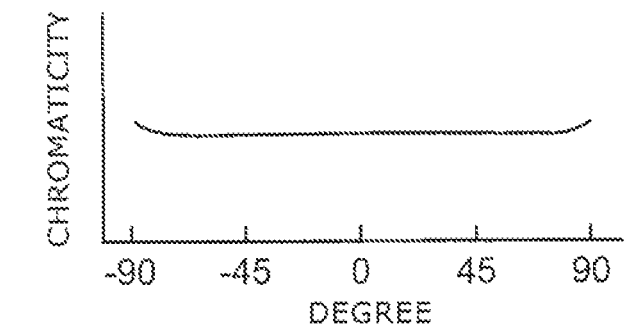
Figure 4A:
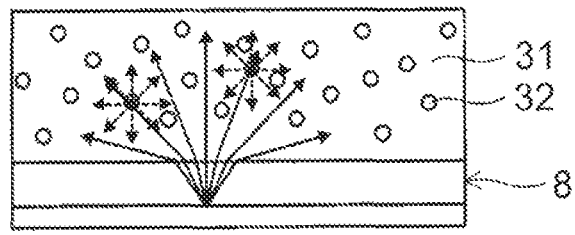
FIG. 4A is a schematic cross-sectional view of the light emitting element and the phosphor layer of a second comparative example.
Figure 4B:
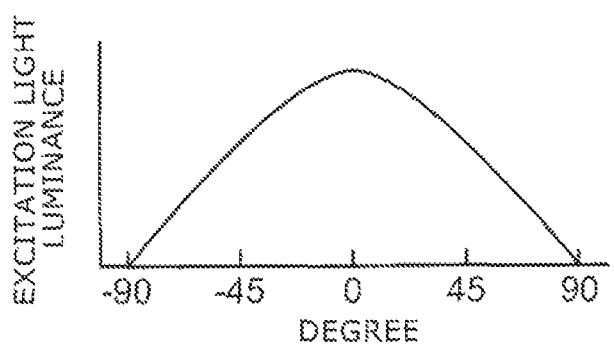
FIG. 4 is a distribution of excitation light brightness in the second comparative example.
FIG. 4C is a distribution of fluorescent brightness in the second comparative example, FIG. 4D a distribution of chromaticity in the second comparative example.
Figure 4C:
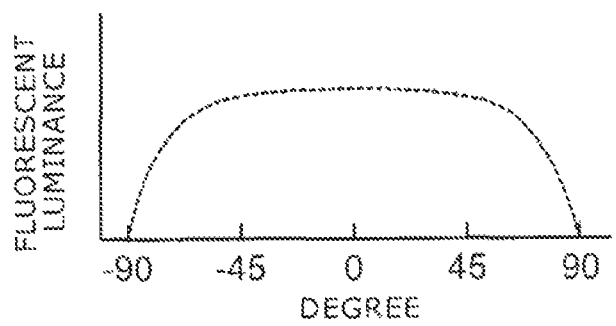
Figure 4D:
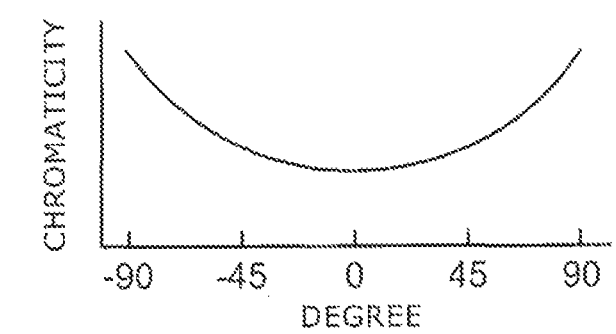
Figure 5A:
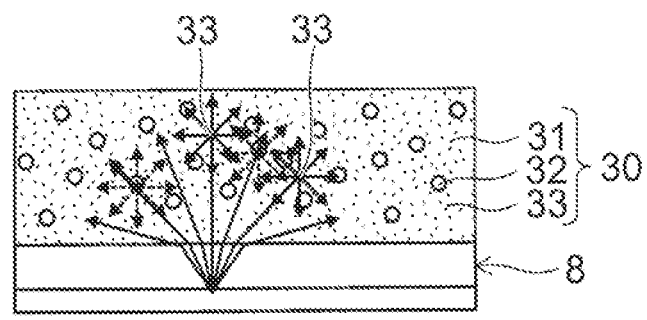
FIG. 5A is a schematic cross-sectional view of the light emitting element and the phosphor layer of the embodiment.
Figure 5B:
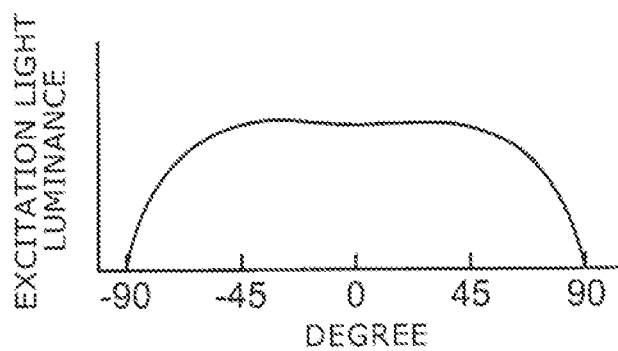
FIG. 5B is a distribution of excitation light brightness in the embodiment.
Figure 5C:
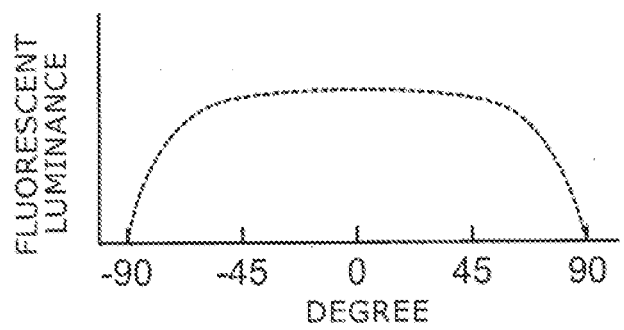
FIG. 5C is a distribution of fluorescent brightness in the embodiment, FIG. 5D a distribution of chromaticity in the embodiment.
Figure 5D:
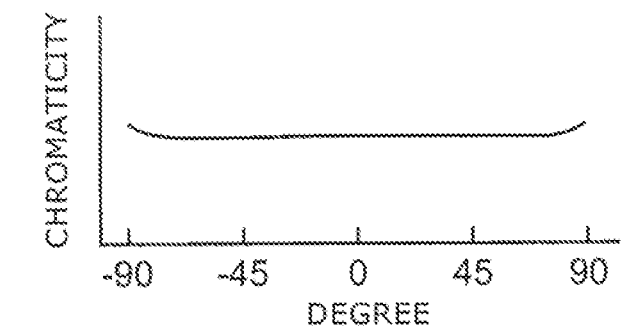

Graphs in FIG. 3B, FIG. 4B and FIG. 5B show a distribution of excitation light brightness in the first comparative example, the second comparative example, and the embodiment, respectively. Graphs in FIG. 3C, FIG. 4C and FIG. 5C show a distribution of fluorescent brightness in the first comparative example, the second comparative example, and the embodiment, respectively. Graphs in FIG. 3D, FIG. 4D and FIG. 5D show a distribution of chromaticity obtained by mixing the excitation light and the phosphor output light in the first comparative example, the second comparative example, and the embodiment, respectively.

A horizontal axis in each of the graphs mentioned above shows an angle θ (a light output angle) formed with respect to a direction (a directly-above direction in FIG. 3A, FIG. 4A and FIG. 5A) which is in a vertical direction to the light pickup face of the light emitting element 8.

In the case of the first comparative example shown in FIG. 3A to 3D, since the active layer is a face light source serving as a two-dimensional aggregation of point light sources, the excitation light brightness distribution can be approximated by a so-called Lambert distribution which is in proportion to cos θ. Further, in the first comparative example, since the phosphor 32 is formed as a face shape, the fluorescent brightness distribution can be approximated by the Lambert distribution in the same manner.

As a result, in the first comparative example, it is characterized in that the distributions of the excitation light and the phosphor output light approximately coincide, a less angle dependency of the chromaticity distribution is provided, and less so-called color breakup phenomenon occurs. In this case, in the first comparative example, there are problems in that the phosphor 32 may tend to be affected by a heat generation of the light emitting element 8, it is hard to adjust an amount of the phosphor 32 so as to adjust a center value of the chromaticity, and one side (a half face) of the phosphor 32 may be strongly excited to allow the fluorescent saturation and the reabsorbed loss on the weak excited face tend to arise.

In the case of the second comparative example shown in FIGS. 4A to 4D, since the phosphor 32 is dispersed (distributed in a dotted manner) into the resin layer 31, it is noted that an influence of the heat generation of the light emitting element 8 is reduced, and the phosphor output saturation is moderated. Further, it is noted that it becomes possible to adjust the center value of the chromaticity by adjusting the thickness of the resin layer 31 into which the phosphor 32 is dispersed.

In the case of the second comparative example, the excitation light is the Lambert distribution in the same manner as in the first comparative example, however, since the phosphor 32 serves as a point light source which radiates a light in all directions in an excited portion, less angle dependency in the output of the phosphor is necessary, that is, it comes to a distribution which expands at a wide angle. As a result, in the second comparative example, there is provided a light output in which the chromaticity is different between the direction directly above the angle of 0 and the direction which is vertical to it, and there is generated a so-called breakup phenomenon in which a color degree (the chromaticity) is different at a viewing angle.

In the embodiment shown in FIGS. 5A to 5D, since the phosphor 32 is dispersed (scattered) into the resin layer 31 in the same manner as in the second comparative example, it is noted that an influence of the heat generation of the light emitting element 8 is reduced, and the phosphor output saturation is moderated, and further, that it becomes possible to adjust the center value of the chromaticity by adjusting the thickness of the resin layer 31 into which the phosphor is dispersed.

Further, in the embodiment, the phosphor output has a wide angle distribution in the same manner as in the second comparative example, however, since the excitation light is scattered by the scattering particle 33 so as to have a wide angle distribution, and the scattering by the scattering particle 33 is the Rayleigh scattering, the scattering of the excitation light is larger than the scattering of the phosphor output light. In the case of adjusting a scattering amount by the size (grain diameter) and the number of the scattering particle 33, a change degree is different between the excitation light and the phosphor output light, and it becomes possible to adjust a distribution shape in such a manner that the distribution of the excitation light and the phosphor output is similar to each other.

Therefore, in accordance with the embodiment, as shown in FIG. 5D, it becomes possible to provide a semiconductor light emitting device in which the distribution of the chromaticity is a flat distribution which does not depend on the angle much, that is, there is less color breakup. Further, since the scattering of the phosphor output is relatively smaller, there is provided an effect that a rate at which the phosphor output is unnecessarily scattered so as to be lost is low, that is a total light emitting efficiency is high.

The adjustment of the brightness distribution mentioned above can be carried out more effectively than the case of a simple scattering particle in which the grain diameter of the scattering particle 33 is not taken into consideration. In other words, in the case of mixing the excitation light and the phosphor output light on the basis of the scattering which does not have any wavelength dependency, it is necessary to scatter these lights until both the lights are uniformly mixed, that is, it is necessary to make the scattering frequency by the scattering particle very high, and the light emitting efficiency of the whole semiconductor light emitting device is frequently lowered by an accumulation of the energy loss at a time of scattering.

However, since the excitation light having a high directivity is selectively scattered in the embodiment, it is sufficient that the frequency is made minimum in which the excitation light and the brightness distribution of the phosphor output are in a similar shape, and there is provided an effect that it becomes possible to minimize the reduction of an overall light emitting efficiency by minimizing the total scattering frequency, specifically, an amount of the scattering particle 33 for scattering.

As mentioned above, in accordance with the embodiment, there is provided an advantage that it becomes possible to uniformize the chromaticity distribution serving as the white light source by mixing the wavelength depending type scattering particle 33 which mainly scatters the excitation light in the phosphor layer 30 which is provided on the light emitting element 8, and it becomes further possible to improve the light emitting efficiency caused by the uniform excitation of the phosphor 32. Accordingly, the semiconductor light emitting device having a high-quality light can be realized by an inexpensive configuration.

Further, in accordance with the embodiment, a fluorescent reflection film 35 is provided between the light emitting element 8 and the phosphor layer 30. The fluorescent reflection film 35 has a higher reflectance with respect to the fluorescent wavelength of the phosphor 32 than a reflectance with respect to the wavelength of the excitation light of the light emitting element 8, and reflects a component directing toward the light emitting element 8 side of the phosphor output light. In other words, the fluorescent reflection film 35 serves in such a manner that it is in a relatively low reflection with respect to the excitation light of the light emitting element 8, and is in a relatively high reflection with respect to the output light of the phosphor 32.

As a result, it becomes possible to reduce a rate at which the phosphor output goes into the inner potion of the light emitting element 8 so as to disappear due to the absorption or the scattering, without greatly reducing a pickup efficiency of the excitation light of the light emitting element 8, and it becomes possible to increase the light emitting efficiency in the case of viewing from the outer portion.

Specifically, a refractive index of the n-type semiconductor layer 6 is set to $n_1$, a refractive index of the fluorescent reflection film 35 is set to $n_2$, a thickness of the fluorescent reflection film 35 is set to $h_2$, an equivalent refractive index of the resin layer 31 is set to $n_3$, and a thickness $h_1$ of the n-type semiconductor layer 6 and a thickness $h_3$ of the resin layer 31 are set so as to be sufficiently larger than an excitation light wavelength $\lambda_0$.

It is set such that $n_2 h_2 = \lambda_0 (1+2m)/4$ (m=0, 1, 2, 3 ...) in the case of $n_1 > n_2 > n_3$, and $n_2 h_2 \lambda_0 (1+m)/2$ (m=0, 1, 2, 3 ...) in the case of $n_2 < n_3 < n_1$.

The thickness of $h_2$ is set such that $n_2 h_2 = \lambda_0/4$, $\lambda_0 3/4$, $\lambda_0 5/4$ ..., in the case of $n_1 > n_2 > n_3$, and $n_2 h_2 = \lambda_0/2$, $\lambda_0$, $\lambda_0 3/2$ ... in the case of $n_2 < n_3 < n_1$.

FIG. 2B shows an example of a wavelength dependency of the reflectance of the fluorescent reflection film 35. The phosphor layer 30 is configured such that the phosphor 32 and the scattering particle 33 are dispersed into the resin sheet ($n_3$ to 1.5), the fluorescent reflection film 35 is set to a silicon nitride ($Si_3N_4$, $n_2$ to 2) thickness of which is 56 nm, and the n-type semiconductor layer 6 is set to GaN ($n_1$ to 2.8).

A solid arrow in FIG. 2B shows an excitation wavelength of the light emitting element 8 ($\lambda_0$=450 nm), and a broken arrow shows a position of a wavelength of a yellow phosphor output (560 nm), and their respective reflectances are 0.06% (450 nm) and 0.97% (560 nm), and a sixteenth-fold difference in reflectance can be obtained. Further, although the light emitting spectrum of the yellow phosphor output is widened to the vicinity of the red region, there is a problem in that a color rendering property is low since the brightness of the red region is low.

In accordance with the fluorescent reflection film 35 of the embodiment, as is understood from FIG. 2B, the reflectance of the wavelength which is away from the excitation light wavelength is high, that is, the reflectance is, for example, 2.8% in the case that the wavelength is 700 nm, 2.8-fold with respect to the yellow fluorescent wavelength (560 nm), and 46-fold with respect to the excitation light wavelength. Hence, the component in which the output light of the phosphor 32 is lost in the light emitting element (the LED chip) 8 is relieved, and the effect that the light having a low brightness and a long wavelength comes to a high reflection is added, whereby an effect of improved color rendering property appears.

This effect is also exhibited in the case that the excitation light is blue ($\lambda_0$=450 nm), $h_2$=56 nm ($n_2 h_2 = \lambda_0/4$) is set, and the green phosphor and the red phosphor are used. The reflectance of the excitation light is about 0.06% in the same manner, however, it is 0.85% in the green (the wavelength of 550 nm), and 2.2% in the red (the wavelength of 650 nm), and the reflectance of about 14-fold and about thirty 36-fold with respect to the reflectance of the excitation light can be obtained.

Figure 1B:
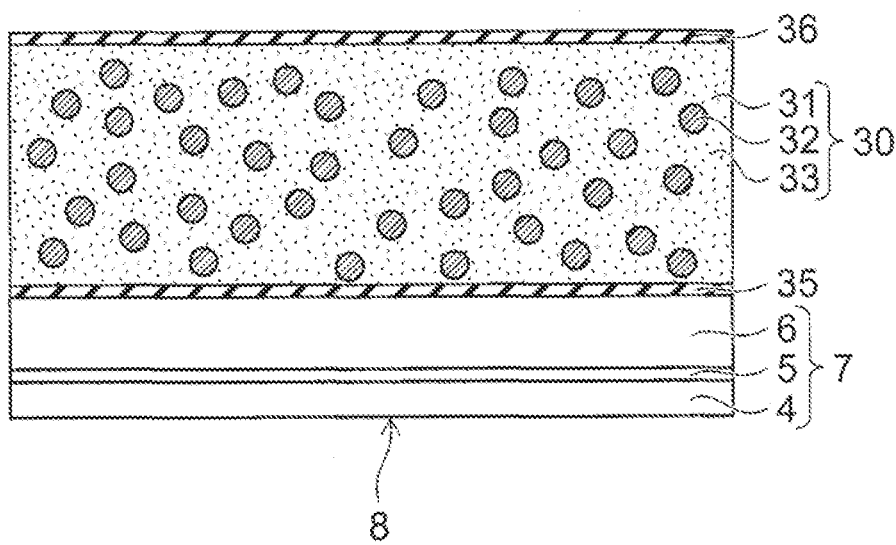

A top coat film 36 may be provided on an upper face of the phosphor layer 30, as shown in FIG. 1B. The top coat film 36 is, for example, a silicon nitride film or a silicon oxide film.

The top coat film 36 allows suppression of a reduction of the light pickup efficiency caused by a refractive index difference between the phosphor layer 30 (a refractive index $n_3$ to 1.5) and the light pickup source (the air, a refractive index $n_5$ to 1.0). The top coat film 36 has a refractive index between the resin layer 31 of the phosphor layer 30 and the air. For example, in the case that the top coat film 36 is not provided, a reflectance of a surface of the phosphor layer 30 is about 4%, and a light pickup loss arises, however, if LiF (a refractive index $n_4$ to 1.39) is provided at 100 nm as the top coat film 36, the reflectance which is not more than 2% (1.6% in the wavelength 550 nm) is provided with respect to the light, wavelength of which is between 430 nm and 750 nm, and the surface reflection loss of the phosphor layer 30 can be reduced 50% or more.

Further, an adhesion (tack property) is lower in the top coat film 35 than in the resin layer 31 of the phosphor layer 30. In other words, a force which is necessary for peeling a support tape (for example, a dicing tape) attached to the top coat film 36 from the top coat film 36 at a fixed speed is smaller than a force which is necessary for peeling the support tape attached to the resin layer 31 of the phosphor layer 30 from the resin layer 31 at a fixed speed.

At a time of dicing mentioned later, the semiconductor light emitting device in the wafer state is attached to the dicing tape via the top coat film 36 in which the adhesion is lower than the resin layer 31 of the phosphor layer 30. Accordingly, it becomes possible to easily peel the semiconductor light emitting device from the dicing tape without damaging the phosphor layer 30, and it becomes possible to improve a handling property of the semiconductor light omitting device after the device is segmented.

Figure 6:
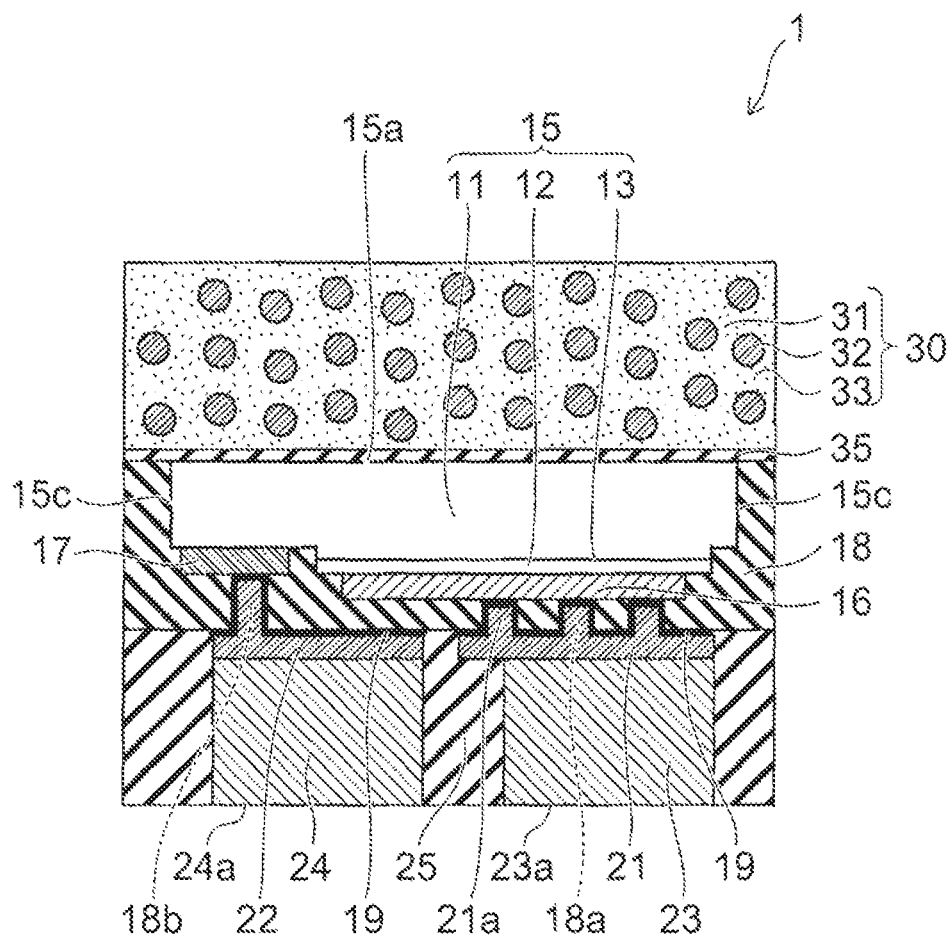
FIG. 6 is a schematic cross-sectional view of a light emitting device of an embodiment.

Next, FIG 6 is a schematic cross sectional view of the semiconductor light emitting device 1 of the embodiment.

The semiconductor light emitting device 1 has the light emitting element, the fluorescent reflection film 35, the phosphor layer 30, and the support body of the light emitting element which is provided on a side facing the phosphor layer 30.

The light emitting element includes a semiconductor layer 15, a p-side electrode 16 and an n-side electrode 17. The semiconductor layer 15 has an active layer 13. Further the semiconductor layer 15 has first face 15a, and a second face on a side facing thereof. An electrode and a support body are provided in a side of the second face, and a light is mainly emitted from the first face 15a on a side facing thereof outside the semiconductor layer 15.

The semiconductor layer 15 has a first semiconductor layer 11 and a second semiconductor layer 12. The first semiconductor layer 11 and the second semiconductor layer 12 include, for example, a gallium nitride. The first semiconductor layer 11 includes, for example, a foundation buffer layer, an n-type GaN layer and the like. The second semiconductor layer 12 includes a p-type GaN layer, and an active layer (light emitting layer) 13. The active layer 13 can employ a material which emits a blue light, a violet light, a violet-blue light, an ultraviolet light or the like.

The second face of the semiconductor layer 15 can be processed as an irregular shape, and a convex portion includes an active layer 13. The p-side electrode 16 is provided on the surface of the second semiconductor layer 12 which is a surface of the convex portion. In other words, the p-side electrode 16 is provided on the second face in the region that has the active layer 13.

A region which does not include the active layer 13 is provided in adjacent to the convex portion in the second face of the semiconductor layer 15, and the n-side electrode 17 is provided on the surface of the first semiconductor layer 11 in the region. In other words, the n-side electrode 17 is provided on the second face in the region that does not include the active layer 13.

As shown in FIG. 9B, on the second face of the semiconductor layer 15 is the area of the second semiconductor layer 12 that includes the active layer 13 wider than the area of the first semiconductor layer 11 that does not include the active layer 13.

Figure 10A:
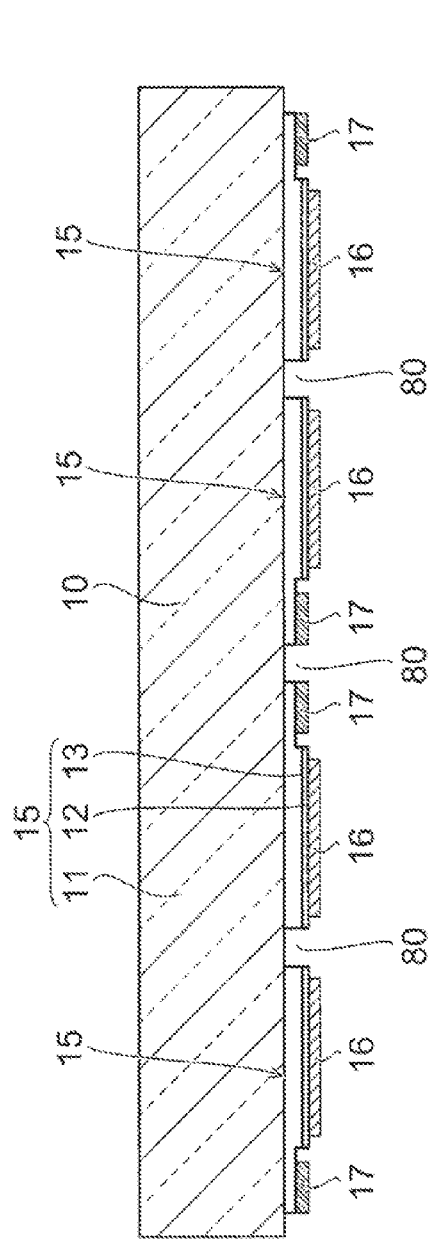
Figure 10B:
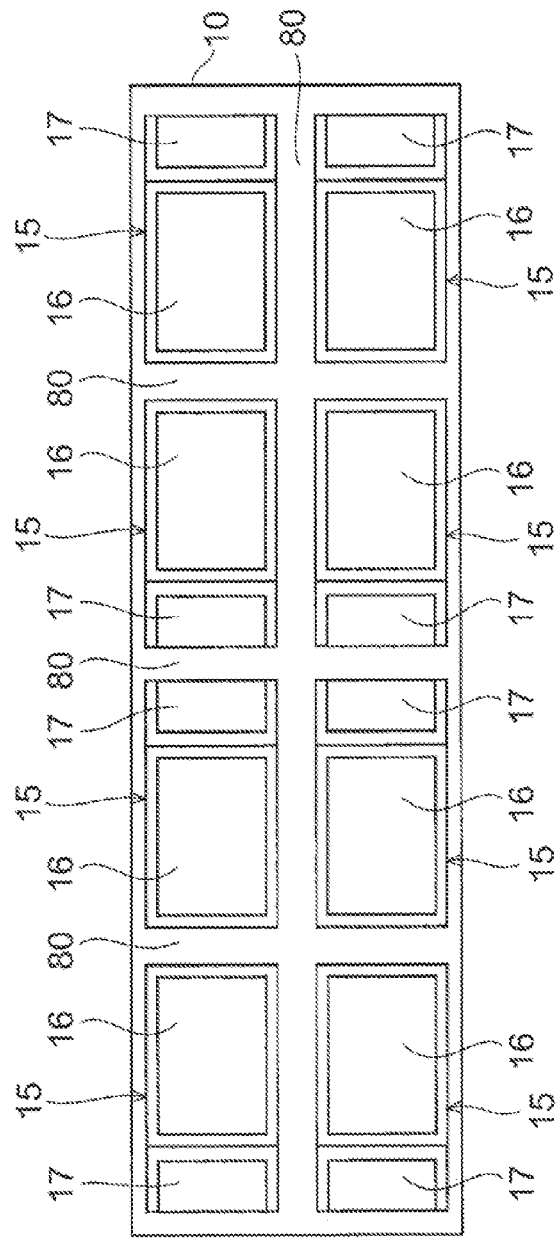

Further, as shown in FIG. 10B, in the semiconductor layer 15 is the area wider in the p-side electrode 16 provided in the region which includes the active layer 13, than in the n-side electrode 17 provided in the region that does not include the active layer 13. Accordingly, a wide light emitting region can be obtained. In this case, a layout of the p-side electrode 16 and the n-side electrode 17 shown in FIG. 10B is one example, and is not limited to this.

A first insulating film (hereinafter, refer simply to as an insulating film) 18 is provided in the second face side of the semiconductor layer 15. The insulating film 18 covers the semiconductor layer 15, the p-side electrode 16 and the n-side electrode 17. Further, the insulating film 18 covers the side surfaces of the active layer 13 and the second semiconductor layer 12 so as to protect them.

In this case, another insulating film (for example, a silicon oxide film) may be provided between the insulating film 18 and the semiconductor layer 15. The insulating film 18 is, for example, a resin such as a polyimide or the like which is excellent in a patterning property of a fine opening. Alternatively, an inorganic film such as a silicon oxide film, a silicon nitride film or the like may be used as the insulating film 18.

The insulating film 18 is not provided on the first face 15a of the semiconductor layer 15. The insulating film 18 covers a side surface 15c that extends from the first face 15a in the semiconductor layer 15 so as to protect them.

A p-side interconnection layer 21 and an n-side interconnection layer 22 are provided on a face on a surface facing the second face of the semiconductor layer 15, in the insulting film 18, so as to be separated from each other.

The p-side interconnection layer 21 is provided within a plurality of first openings 18a which reach the p-side electrode 16 and are formed in the insulating film 18, and is electrically connected to the p-side electrode 16. The n-side interconnection layer 22 is formed within a second opening 18b which reaches the n-side electrode 17 and is formed in the insulating film 18, and is electrically connected to the n-side electrode 17.

A p-side metal pillar 23 is provided in a face on a side facing the p-side electrode 16 in the p-side interconnection layer 21. The p-side interconnection layer 21, the p-side metal pillar 23 and the metal film 19 which is used as a seed layer mentioned later configure the p-side interconnection portion in the embodiment.

An n-side metal pillar 24 is provided in a face on a side facing the n-side electrode 17 in the n-side interconnection layer 22. The n-side interconnection layer 22, the n-side metal pillar 24, and the metal film 19 which is used as the seed layer mentioned later configure the n-side interconnection portion in the embodiment.

For example, a resin layer 25 is stacked as a second insulating film on the insulating film 18. The resin layer 25 covers a periphery of the p-side interconnection portion and a periphery of the n-side interconnection portion. Further, the resin layer 25 is filled between the p-side metal pillar 23 and the n-side metal pillar 24.

The side surface of the p-side metal pillar 23 and the side surface of the n-side metal pillar 24 are covered by the resin layer 25. A face on a side facing the p-side interconnection layer 21 in the p-side metal pillar 23 is exposed from the resin layer 25, and serves as a p-side outer terminal 23a. A face on a side facing the n-side interconnection layer 22 in the n-side metal pillar 24 is exposed from the resin layer 25 and serves as are n-side outer terminal 24a.

The p-side outer terminal 23a and the n-side outer terminal 24a are bonded to a pad which is formed in a mounting substrate, via a bonding material such as a solder, the other metals, a conductive material or the like.

A distance between the p-side outer terminal 23a and the n-side outer terminal 24a which are exposed on the same face (the lower face in FIG. 6) in the resin layer 25 is larger than a distance between the p-side interconnection layer 21 and the n-side interconnection layer 22 on the insulating film 18. The p-side outer terminal 23a and the n-side outer terminal 24a are separated at a distance at which they are not short circuited with each other by the solder or the like at a time of mounting them to the mounting substrate.

The p-side interconnection layer 21 can be moved close to the n-side interconnection layer 22 to a critical limit on a process, and it becomes possible to widen the area of the p-side interconnection layer 21. As a result, it becomes possible to achieve an enlargement of a contact face between the p-side interconnection layer 21 and the p-side electrode 16, and it becomes possible to improve a current distribution and a heat radiating property.

An area by which the p-side interconnection layer 21 comes into contact with the p-side electrode 16 through a plurality of first openings 18a is larger than an area in which the n-side interconnection layer 22 comes into contact with the n-side electrode 17 through the second opening 18b. Accordingly, a current distribution to the active layer 13 is improved, and a heat radiating property of the active layer 13 can be improved.

An area of the n-side interconnection layer 22 expanding on the insulating film 18 is larger than an area in which the n-side interconnection layer 22 comes into contact with the n-side electrode 17.

In accordance with the embodiment, it becomes possible to obtain a high output of light by the active layer 13 which is formed over a wider region than that in the n-side electrode 17. In this case, the n-side electrode 17 which is provided in a narrower region than the region which includes the active layer 13 is drawn out as the n-side interconnection layer 22 having a wider area to the mounting face side.

The first semiconductor layer 11 is electrically connected to the n-side metal pillar 24 which has the n-side outer terminal 24a, via the n-side electrode 17, the metal film 19 and the n-side interconnection layer 22. The second semiconductor layer 12 which includes the active layer 13 is electrically connected to the p-side metal pillar 23 which has the p-side outer terminal 23a, via the p-side electrode 16, the metal film 19 and the p-side interconnection layer 21.

The p-side metal pillar 23 is thicker than the p-side interconnection layer 21, and the n-side metal pillar 24 is thicker than the n-side interconnection layer 22. A thickness of each of the p-side metal pillar 23, the n-side metal pillar 24 and the resin layer 25 is thicker than that of the semiconductor layer 15. Here, "thickness" in this case refers to a thickness in a vertical direction in FIG. 6.

Further, a thickness of each of the p-side metal pillar 23 and the n-side metal pillar 24 is thicker than a thickness of a stacked body which includes the semiconductor layer 15, the p-side electrode 16, the n-side electrode 17 and the insulating film 18. In this case, an aspect ratio (a ratio of a thickness with respect to a plane size) of each of the metal pillars 23 and 24 is not limited to be not less than 1, but the ratio may be smaller than 1. In other words, the metal pillars 23 and 24 may be configured such that the thickness is smaller than that of the plane size.

In accordance with the embodiment, even if the substrate 10 which is used for forming the semiconductor layer 15 and is mentioned later is removed, it becomes possible to stably support the semiconductor layer 15 by the p-side metal pillar 23, the n-side metal pillar 24 and the resin layer 25, to enhance a mechanical strength of the semiconductor light emitting device 1.

As the material of the p-side interconnection layer 21, the n-side interconnection layer 22, the p-side metal pillar 23 and the n-side metal pillar 24, a copper, a gold, a nickel, a silver and the like can be used. Among them, if the copper is used, a good heat conductivity, a high migration resistance and an excellent adhesion to the insulating material may be obtained.

The resin layer 25 reinforces the side metal pillar 23 and the n-side metal pillar 24. For the resin layer 25, employing a configuration in which a coefficient of thermal expansion is the same as or approximate to that for the mounting substrate is desired. As the resin layer 25 mentioned above, there can be listed up, for example, an epoxy resin, a silicone resin, a fluorocarbon resin and the like.

Further, in a state in which the semiconductor light emitting device 1 is mounted to the mounting substrate which is not illustrated, via the p-side outer terminal 23a and the n-side outer terminal 24a, it becomes possible to reduce a stress which is applied to the semiconductor layer 15 via the solder or the like, by absorbing the stress by the p-side metal pillar 23 and the n-side metal pillar 24.

The p-side interconnection portion which includes the p-side interconnection layer 21 and the p-side metal pillar 23 is connected to the p-side electrode 16 via a plurality of via 21a which are provided within a plurality of first openings 18a and are segmented from each other. Accordingly, a high stress reducing effect by the p-side interconnection portion can be obtained.

Figure 21A:
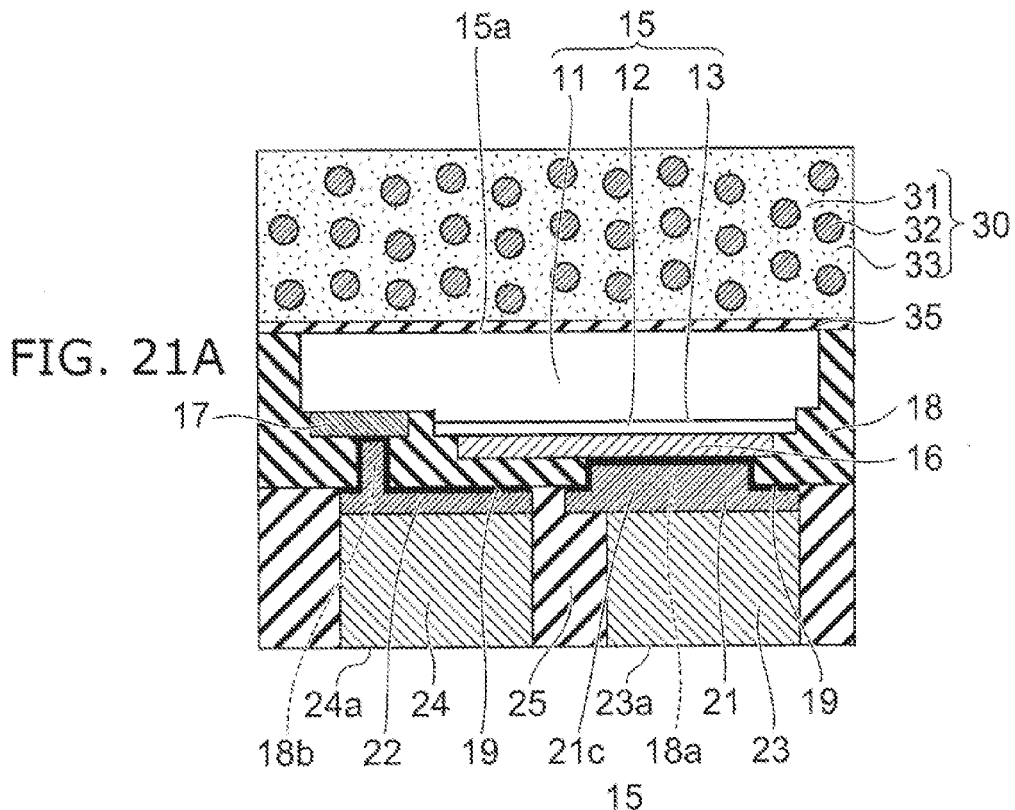
FIGS. 21A and 21B are schematic views of a light emitting device of another specific example of the embodiment.

Alternatively, as shown in FIG. 21A, the p-side interconnection layer 21 may be connected to the p-side electrode 16 via a post 21c which is provided within one large first opening 18a and is larger in a plane size than the via 21a. In this case, it becomes possible to achieve an improvement of a heat radiating property of the active layer 13 through the p-side electrode 16, the p-side interconnection layer 21 and the p-side metal pillar 23 which are all made of metal.

As mentioned later, the substrate 10 which is used at a time of forming the semiconductor layer 15 is removed from the surface of the first face 15a. Accordingly, it becomes possible to make a back of the semiconductor light emitting device 1 low.

Micro concavities and convexities are formed, as appropriate, on the first face 15a of the semiconductor layer 15, in order to improve the light pickup efficiency.

A phosphor layer 30 is provided on the first face 15a via the fluorescent reflection film 35 mentioned above. Therefore, it becomes possible to uniformize the chromaticity distribution to further improve the light emitting efficiency, even in the semiconductor light emitting device 1.

Next, a description will be given of a manufacturing method of the semiconductor light emitting device 1 of the embodiment, with reference to FIG. 7, to FIG. 18B. FIG. 7A to FIG. 18B show a partial region in a wafer state.

FIG. 7A shows a stacked body in which the first semiconductor layer 11 and the second semiconductor layer 12 are formed on a main face (a lower face in FIG. 7A) of the substrate 10. FIG. 7B corresponds to a lower elevational view in FIG. 7A.

The first semiconductor layer 11 is formed on the main face of the substrate 10, and the second semiconductor layer 12 which includes the active layer 13 is formed thereon. The first semiconductor layer 11 and the second semiconductor layer 12 which include a gailium nitride can be crystalline grown, for example, on a sapphire substrate in accordance with a metal organic chemical vapor deposition (MOCVD) method. Alternatively, the silicon substrate can be used as the substrate 10.

A face which comes into contact with the substrate 10 in the first semiconductor layer 11 is the first face 15a of the semiconductor layer 15, and a surface or the second semiconductor layer 12 is the second face 15b of the semiconductor layer 15.

Next, a groove 80 which passes through the semiconductor layer 15 and reaches the substrate 10 is formed, as shown in FIG. 8A and FIG. 8B which is a lower elevational view thereof, for example, in accordance with a reactive ion etching (RIE) method using a resist which is not illustrated. The groove 80 is formed, for example, in a lattice shape on the substrate 10 in the wafer state, and separates the semiconductor layer 15 into a plurality of chips on the substrate 10.

In this case, a process of separating the semiconductor layer 15 in a plurality of sections may be carried out after selectively removing the second semiconductor layer 12 mentioned later or after forming the electrode.

Next, a part of the second semiconductor layer 12 is removed and a part of the first semiconductor layer 11 is exposed, as shown in FIG. 9A and FIG. 9B which is a lower elevational view thereof, for example, in accordance with the RIE method using the resist which is not illustrated. A region to which the first semiconductor layer 11 is exposed does not include the active layer 13.

Next, as shown in FIG. 10A and FIG. 10B which is a lower elevational view thereof, the p-side electrode 16 and the n-side electrode 17 are formed on the second face of the semiconductor layer 15. The p-side electrode 16 is formed on the surface of the second semiconductor layer 12. The n-side electrode 17 is formed on the exposed face of the first semiconductor layer 11.

The p-side electrode 16 and the n-side electrode 17 are formed, for example, in accordance with a sputter method, a vapor deposition method or the like. Whichever of the p-side electrode 16 and the n-side electrode 17 may be first to be formed, or they may be formed simultaneously by a same material.

The p-side electrode 16 includes, for example, a silver, a silver alloy, an aluminum, an aluminum alloy or the like which has a reflecting property with respect to the light emitting light of the active layer 13. Further, in order to prevent a sulfuration and an oxidation of the p-side electrode 16, it may be configured such as to include a metal protecting film (a barrier metal).

Further, for example, a silicon nitride film or a silicon oxide film may be formed in accordance with a chemical vapor deposition (CVD) method, as a passivation film between the p-side electrode 16 and the n-side electrode 17, or on the end face (the side surface) of the active layer 13. Further, an activation anneal or the like for obtaining an ohmic contact between each of the electrodes and the semiconductor layer may be executed as required.

Next, after covering all the exposed portions on the main face of the substrate 10 by the insulating film 18 shown in FIG. 11A, the insulating film 18 is patterned, for example, by the wet etching, and the first opening 18a and the second opening 18b are formed selectively in the insulating film 18. A plurality of first openings 18a are formed, and each of the first openings 18a reaches the p-side electrode 16. The second opening 18b reaches the n-side electrode 17.

As the insulating film 18, for example, there can be employed an organic material such as a photosensitive polyimide, a benzocyclobutene or the like. In this case, it becomes possible to directly expose and develop the material with respect to the insulating film 18 without using any resist.

Alternatively, an inorganic film such as a silicon nitrogen film, a silicon oxide film or the like may be used as the insulating film 18. In the case that the insulating film 18 is the inorganic film, the first opening 18a and the second opening 18b are formed by an etching after patterning the resist which is formed on the insulating film 18.

Next, the metal film 19 is formed, as shown in FIG. 11B, on the surface of the insulating film 18, the inner wall (the side wall and the bottom portion) of the first opening 18a, and the inner wall (the side wall and the bottom portion) of the second opening 18b. The film 19 is used as a seed metal for plating mentioned later.

The metal film 19 is formed, for example, in accordance with the sputter method. The metal film 19 includes, for example, a stacked film of a titanium (Ti) and a copper (Cu) which are stacked in this order from the insulating film 18 side. Alternatively, an aluminum film may be used in place of the titanium film.

Next, as shown in FIG. 11C, a resist 91 is selectively formed on the metal film 19, and a Cu electrolyte plating using the metal film 19 as a current route is carried out.

Figure 12A:
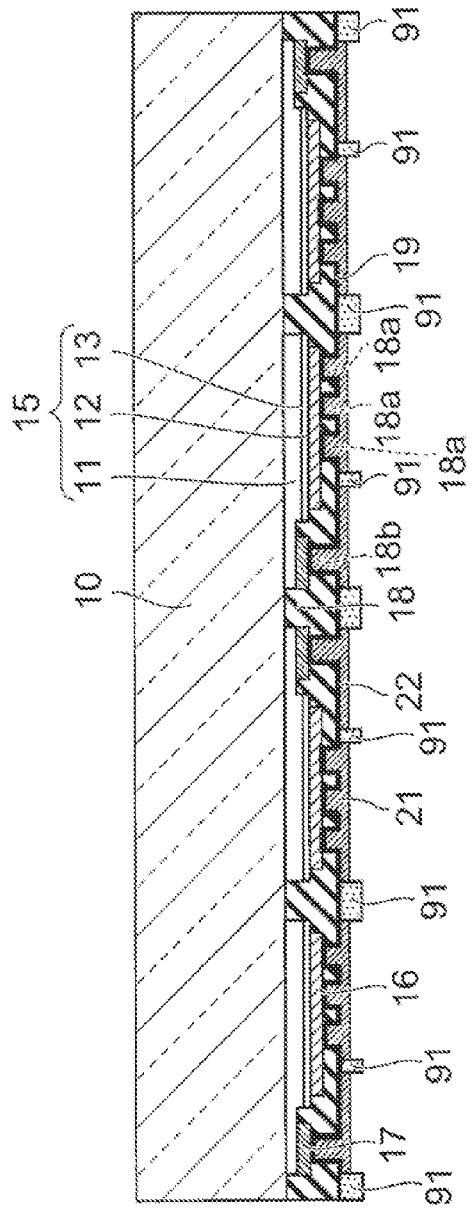
Figure 12B:
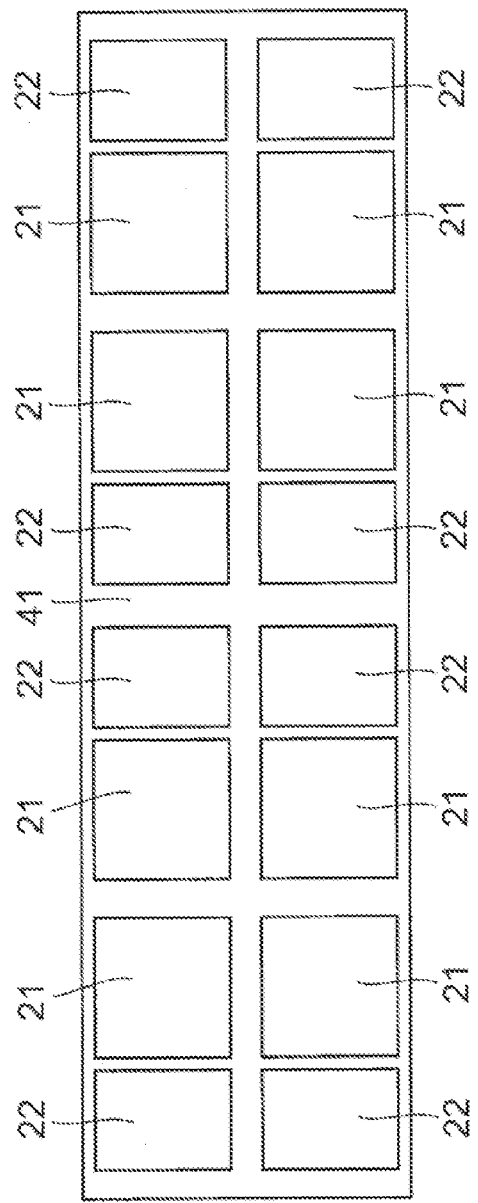

Accordingly, as shown in FIG. 12A and FIG. 12B corresponding to a lower elevational view thereof, the p-side interconnection layer 21 and the n-side interconnection layer 22 are selectively formed on the metal film 19. The p-side interconnection layer 21 and the n-side interconnection layer 22 are formed simultaneously in accordance with a plating method and are made, for example, of a cupper material.

The p-side interconnection layer 21 is formed within the first opening 18a, and is electrically connected to the p-side electrode 16 via the metal film 19. The n-side interconnection layer 22 is formed within the second opening 18b, and is electrically connected to the n-side electrode 17 via the metal film 19.

The resist 91 which is used for plating the p-side interconnection layer 21 and the n-side interconnection layer 22 is removed using solvent or an oxygen plasma.

Figures 13A, 13B:
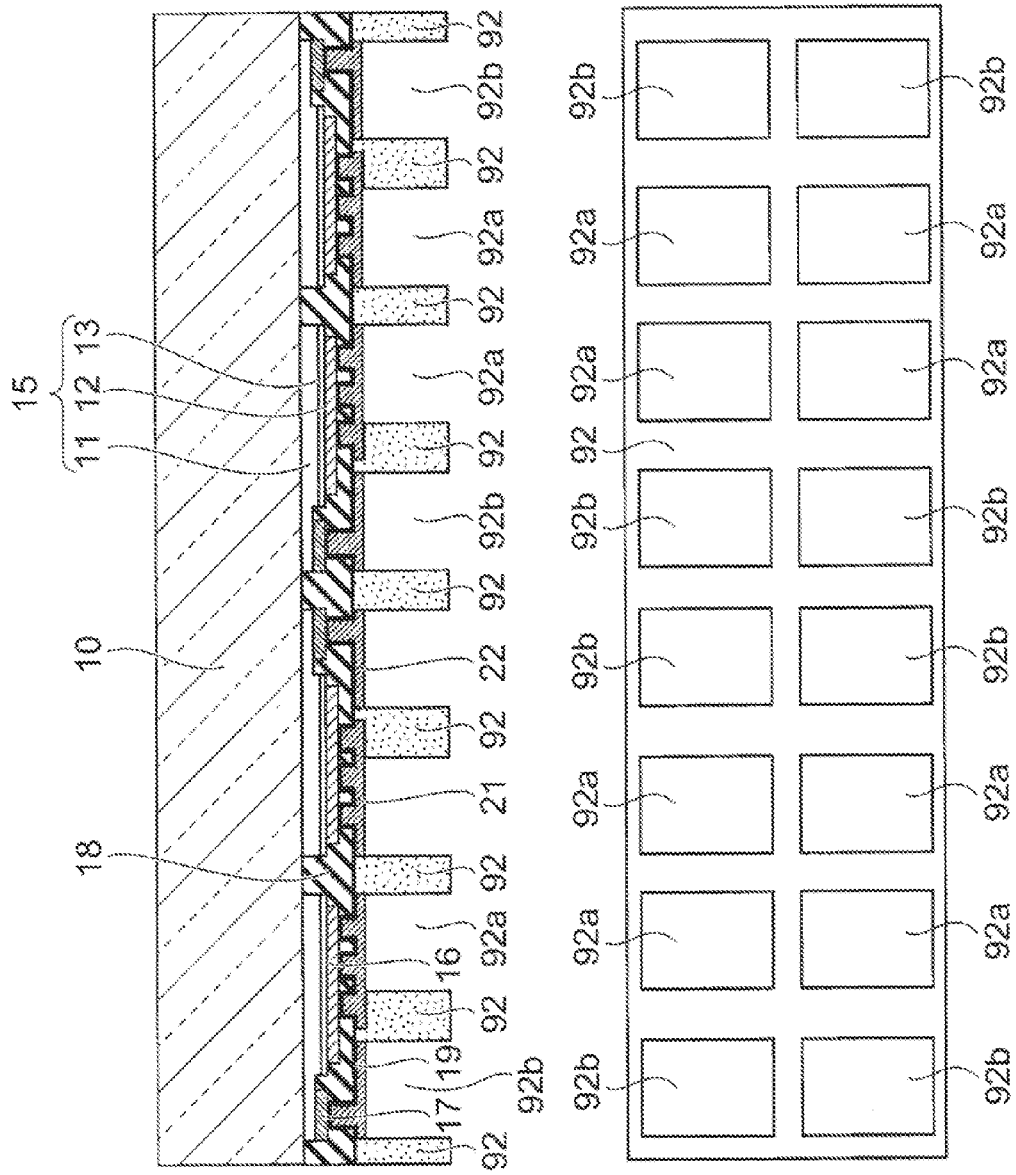

Next, as shown in FIG. 13A and FIG. 13B corresponding to a lower elevational view thereof, a resist 92 for forming the metal pillar is formed. The resist 92 is thicker than the resist 91 mentioned above. In this case, the resist 91 may be left without being removed in the preceding process, and the resist 92 may be formed in an overlapping manner with the resist 91. A first opening 92a and a second opening 92b are formed in the resist 92.

Figures 14A, 14B:
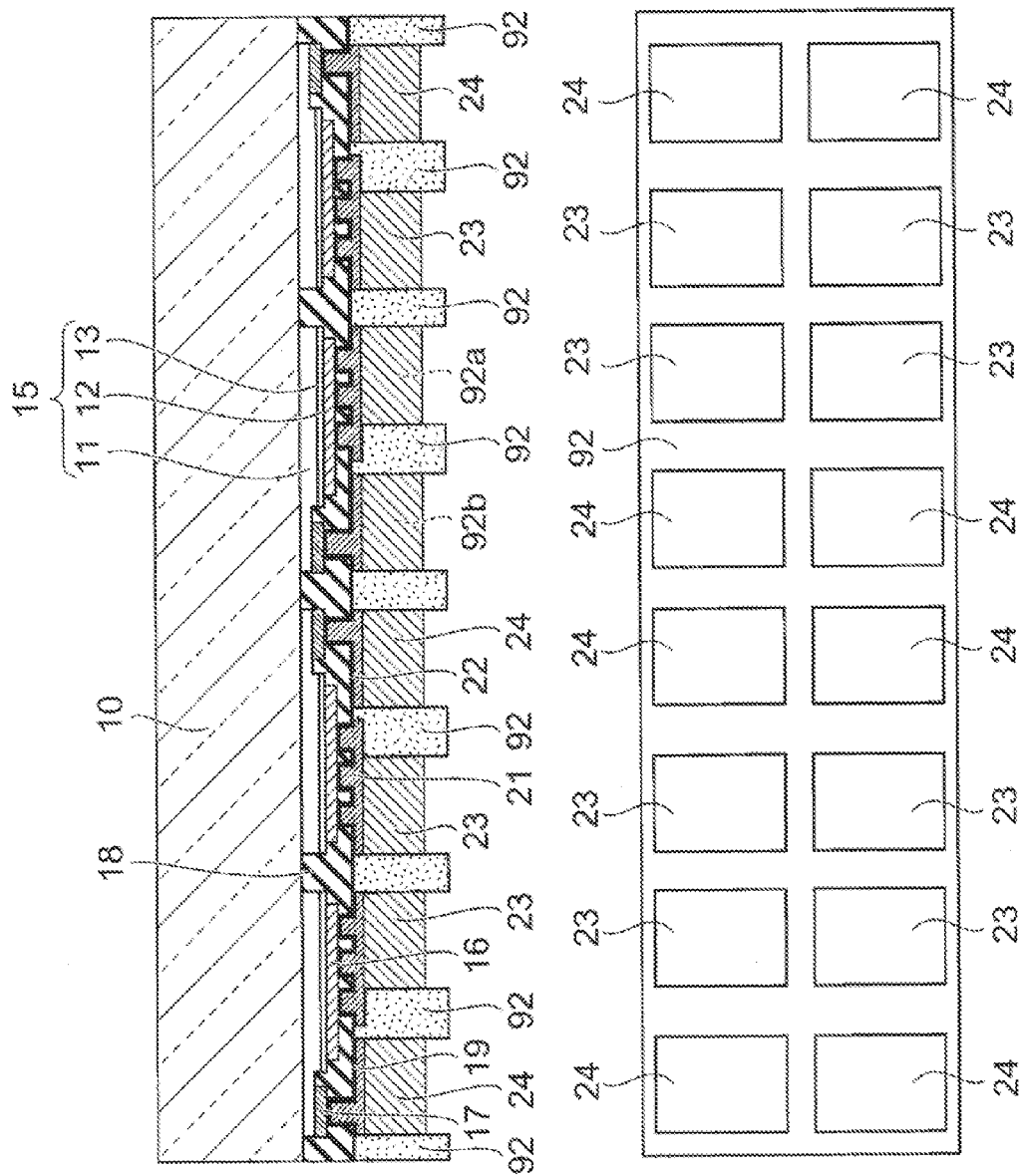

Further, a Cu electrolyte plating in which the metal film 19 is used as a current route is carried out using the resist 92 as a mask. Accordingly, as shown in FIG. 14A and FIG. 14B corresponding to a lower elevational view thereof, the p-side metal pillar 23 and the n-side metal pillar 24 are formed.

The p-side metal pillar 23 is formed on the surface the p-side interconnection layer 21 within the first opening 92a which is formed in the resist 92. The n-side metal pillar 24 is formed on the surface of the n-side interconnection layer 22 within the second opening 92b which is formed in the resist 92. The p-side metal pillar 23 and the n-side metal pillar 24 are formed simultaneously in accordance with the plating method, and are made, for example, of a cupper material.

The resist 92 is removed, for example, using the solvent or the oxygen plasma, as shown in FIG. 15A. Thereafter, the exposed portion of the metal film 19 is removed in accordance with the wet etching, by using the metal pillar 23, the n-side metal pillar 24, the p-side interconnection layer 21 and the n-side interconnection layer 22 as a mask. Accordingly, as shown in FIG. 15B, the electric connection via the metal film 19 between the p-side interconnection layer 21 and the n-side interconnection layer 22 is segmented.

Figures 16A, 16B:
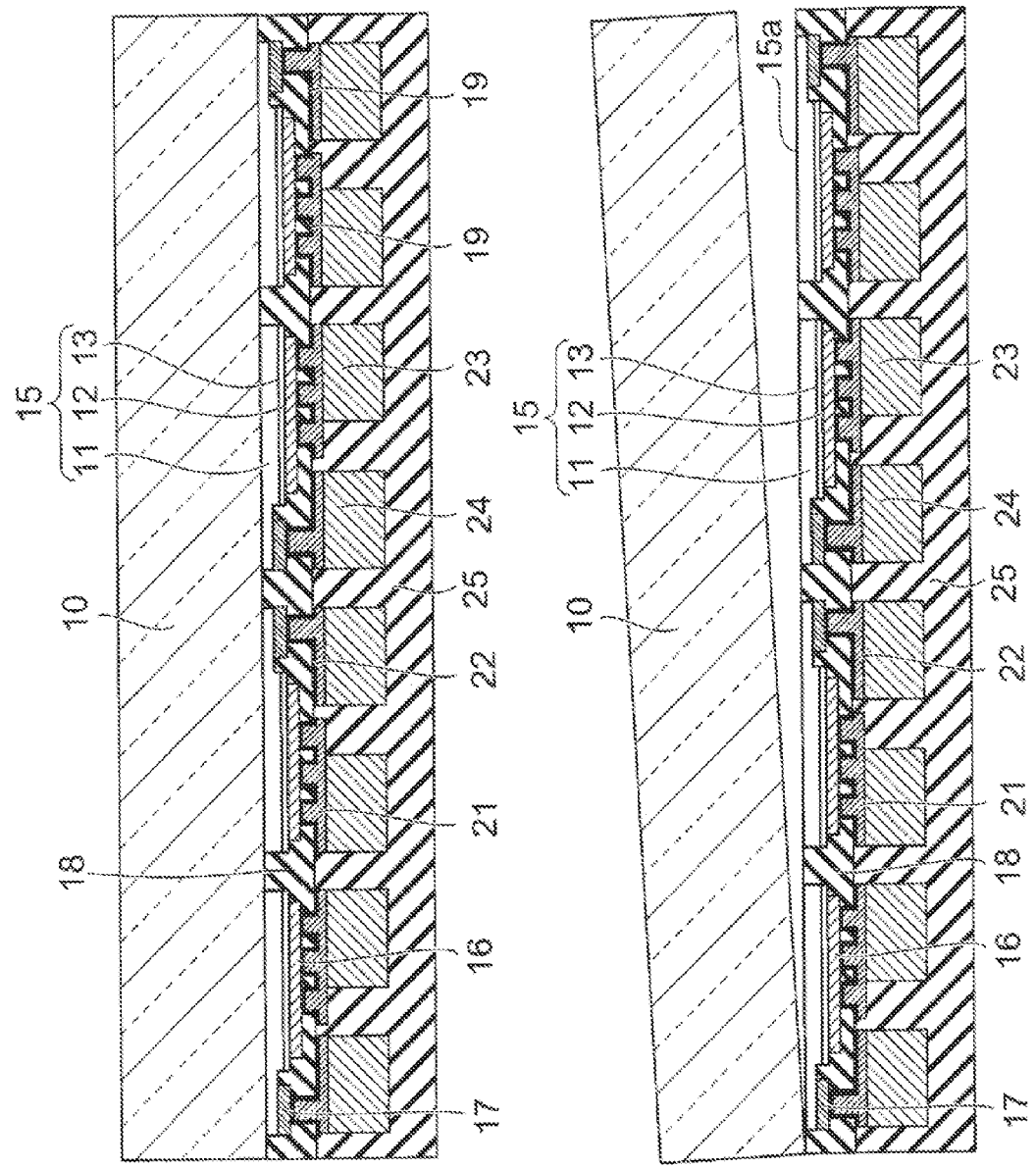

Next, as shown in FIG. 16A, the resin layer 25 is stacked with respect to the insulating film 18. The resin layer 25 covers the p-side interconnection layer 21, the n-side interconnection layer 22, the p-side metal pillar 23 and the n-side metal pillar 24.

The resin layer 25 has an insulating proper. Further, carbon black may be included in the resin layer 25, for example, and a light insulating property may be given to the light emitting light of the light emitting layer 13.

Next as shown in FIG. 16B, the substrate 10 is removed. In the case that the substrate 10 is a sapphire substrate, the substrate 10 can be removed, for example, in accordance with a laser liftoff method. Specifically, a laser light is irradiated toward the first semiconductor layer 11 from a back face side of the substrate 10. The laser light has a transparence with respect to the substrate 10, and has a wavelength which is an absorbing region with respect to the first semiconductor layer 11.

If the laser light reaches an interface between the substrate 10 and the first semiconductor layer 11, the first semiconductor layer 11 in the vicinity of the interface absorbs an energy of the laser light so as to be decomposed. The first semiconductor layer 11 is decomposed into a gallium (Ga) and a nitrogen gas. In accordance with a decomposing reaction, a micro gap is formed between the substrate 10 and the first semiconductor layer 11, and the substrate 10 and the first semiconductor layer 11 are separated.

The substrate 10 is removed by carrying out an irradiation of the laser light over the whole wafer at a plurality of times per a set region.

In the case that the substrates 10 is the silicon substrate, the substrate 10 can be in accordance with an etching.

Since the above stacked body which is formed on the main face of the substrate 10 is reinforced by the p-side metal pillar 23, the n-side metal pillar 24 and the resin layer which are thicker than the semiconductor layer 15, the wafer state can be maintained even if the substrate 10 runs short.

Further, the resin layer 25, and the metal configuring the p-side metal pillar 23 and the n-side metal pillar 24 are a more flexible material in comparison with the semiconductor layer 15. The semiconductor layer 15 is supported by the flexible support body mentioned above. Accordindly, even if a great internal stress which is generated at a time of epitaxial growing the semiconductor layer 15 on the substrate 10 is released at a stroke at a time of peeling off the substrate 10, it becomes possible to avoid the breakage of the semiconductor layer 15.

The first face 15a of the semiconductor layer 15 from which the substrate 10 is removed is washed. The gallium (Ga) attached to the first face 15a is removed, for example, by a diluted hydrofluoric acid or the like.

Thereafter, as appropriate, the first face 15a is wet etched, for example, a potassium hydroxide (KOH) water solution, tetramethylammonium hydroxide (TMAH) or the like. Accordingly, the concavities and convexities are formed on the first face 15a on the basis of a difference of an etching speed which depends on the crystal face direction, and it becomes possible to improve the light pickup efficiency.

Next, as shown in FIG. 17B, the fluorescent reflection film 35 is formed on the first face 15a, and the phosphor layer 30 is formed further on the fluorescent reflection film 35. The fluorescent reflection film 35 and the phosphor layer 30 are formed on the insulating film 18 between the adjacent semiconductor layers 15.

For example, silicon nitride film can be formed as the fluorescent reflection film 35 to accordance with CVD method. Thereafter, the liquid resin in which the phosphor 32 and the scattering particle 33 are dispersed is supplied onto the fluorescent reflection film 35, for example, in accordance with a printing method, a potting method, a molding method, a compression forming method or the like, and is thereafter thermo-hardened, whereby the phosphor layer 30 is formed.

Figure 18A:
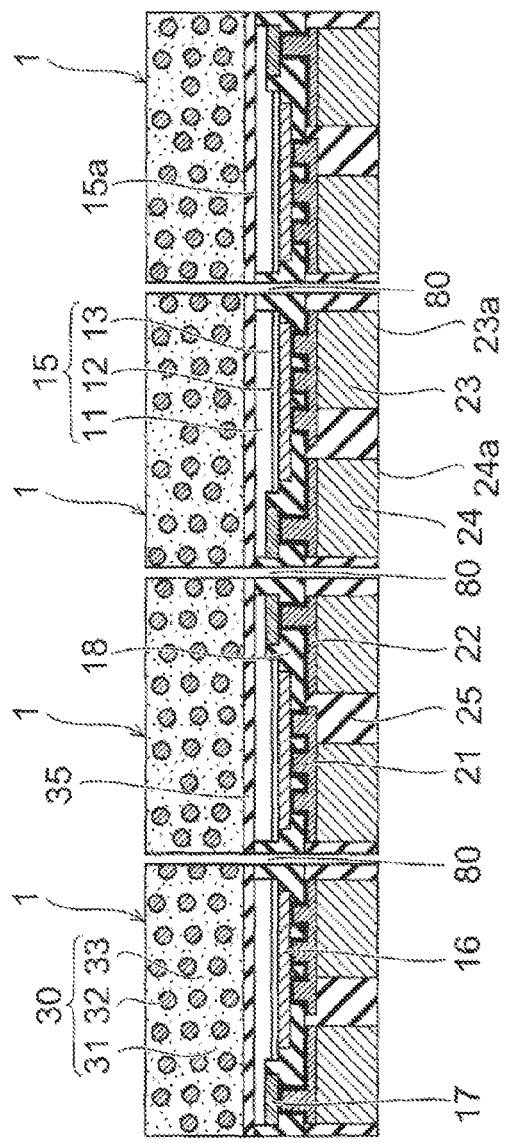
Figure 18B:
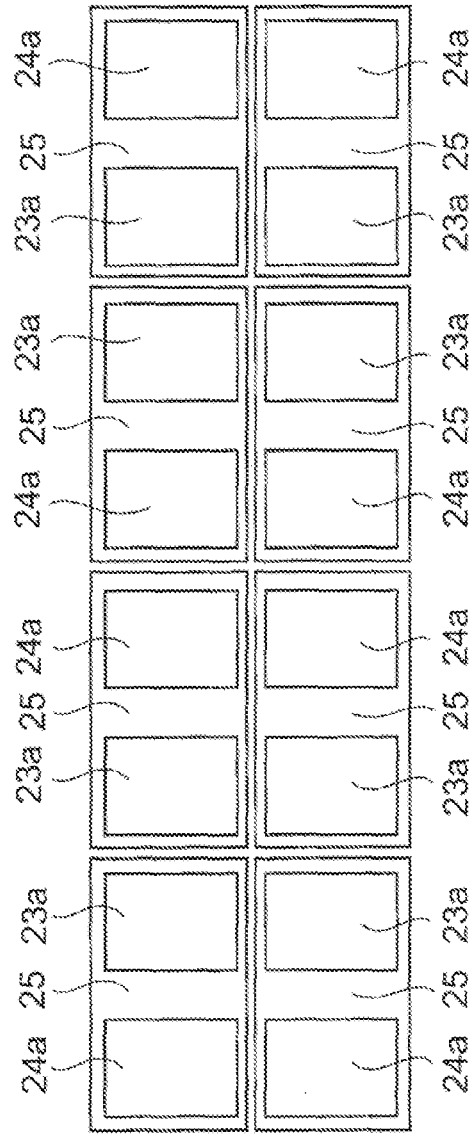

Next, a surface (a lower face in FIG. 17B) of the resin layer 25 is ground, and the p-side outer terminal 23a and the n-side outer terminal 24a are exposed, as shown in FIG. 18A and FIG. 18B corresponding to a lower elevational view thereof.

Thereafter, the phosphor layer 30, the fluorescent reflection film 35, the insulating film 18 and the resin layer 25 are cut at a position of the groove 80 mentioned above, and are segmented into a plurality of semiconductor light emitting devices 1. For example, they are cut using a dicing blade. Alternatively, they may be cut in accordance with a laser irradiation.

The substrate 10 has been already removed at a time of dicing. Further, since there is no semiconductor layer 15 in the groove 80, it becomes possible to avoid a damage to which the semiconductor layer 15 is exposed at a time of dicing. Further, without any additional process after segmenting, it becomes possible to obtain a configuration in which the end portion (the side surface) of the semiconductor layer 15 is covered and protected by the insulating film 18.

In this case, the segmented semiconductor light emitting device 1 may be formed as a single chip configuration which includes one semiconductor layer 15 or may be formed as a multiple chip configuration which includes a plurality of semiconductor layers 15.

Since each of the processes mentioned above before dicing is carried out in a lump in the wafer state, it is not necessary to carry out a interconnection and a packaging per the segmented individual device, and it becomes possible to greatly reduce a production cost. In other words, the interconnection and the packaging have been already carried out in the segmented state. Accordingly, it becomes possible to enhance a productivity. As a result, it is easy to reduce a cost.

On the first face 15a, a lens 36 may be provided as that of a semiconductor light emitting device 2 shown in FIGS. 19A to 19C and FIG. 20 The lens 36 is not limited to be formed as a concave shape, but may be formed as a convex shape.

Figure 19A:
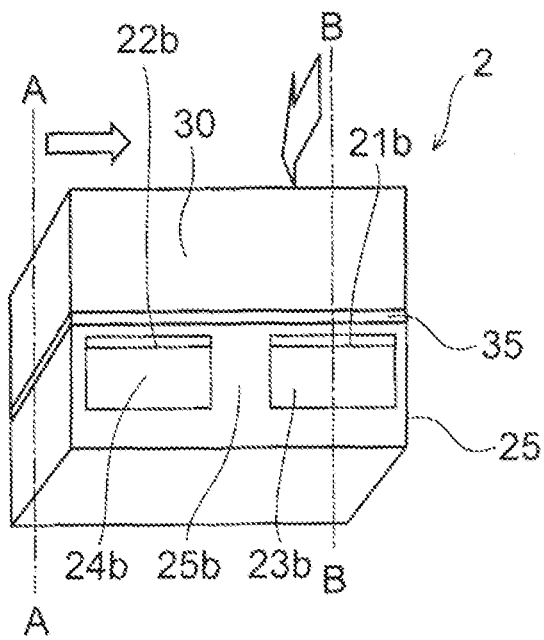
FIGS. 19A to 19C are schematic views of a light emitting device of another specific example of the embodiment.
Figure 19B:
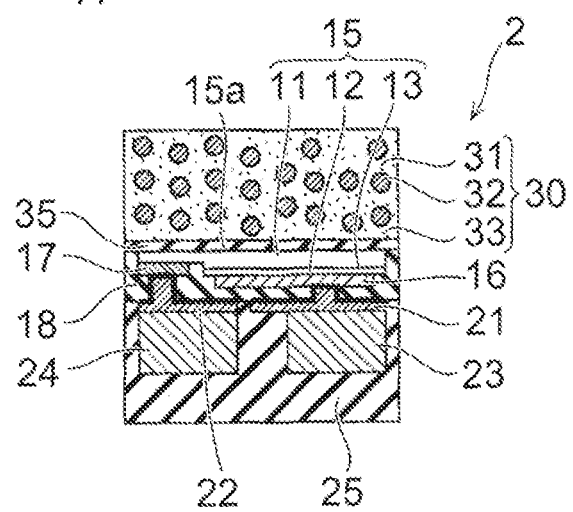
Figure 19C:
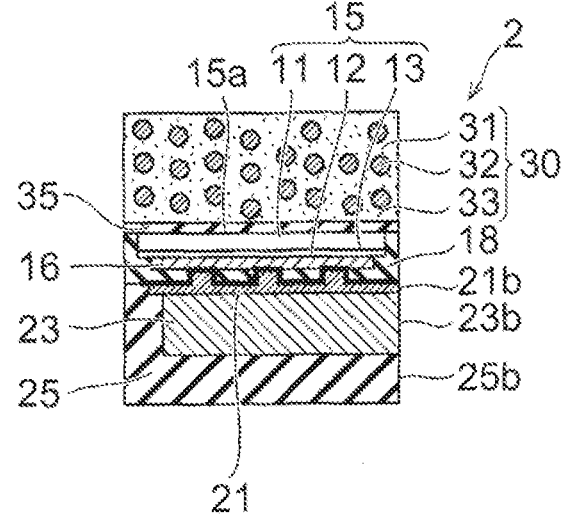

FIG. 19A is a schematic perspective view of the semiconductor light emitting device 2 of a variation of the embodiment. FIG. 19B is a cross sectional view along a line A-A in FIG. 19A. FIG. 19C is a cross sectional view along a line B-B in FIG. 19A.

Figure 20:
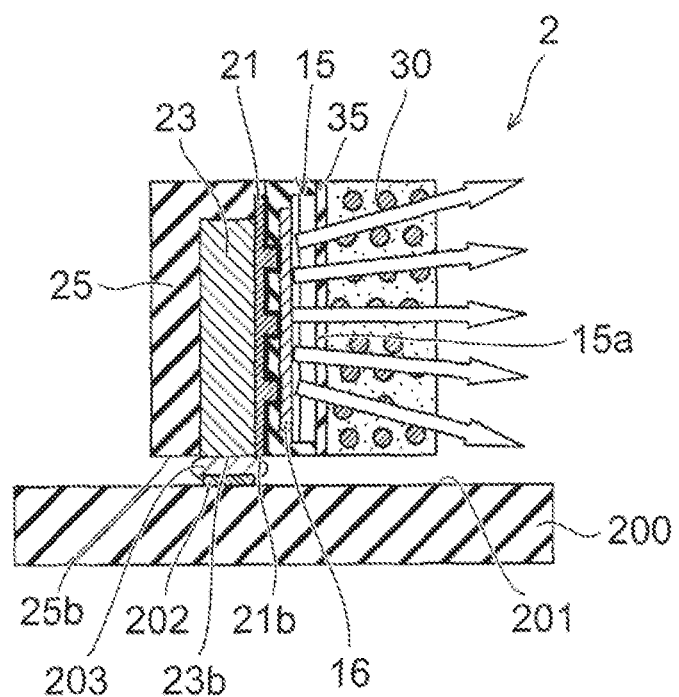
FIG. 20 is a schematic cross-sectional view of the semiconductor light emitting device shown in FIG. 19 mounted on a mount substrate.

FIG. 20 is a schematic cross sectional view of a light emitting module having a configuration in which the semiconductor light emitting device 2 is mounted on a mounting substrate 200.

As shown in FIGS. 19A and 19C, a side surface of a part of the p-side metal pillar 23 is a third face 25b having a different face direction from that of the first face 15a and the second face of the semiconductor layer 15, and is exposed from the resin layer 25. The exposed face serves as the p-side outer terminal 23b for mounting to the mounting substrate in an outer portion.

The third face 25b is a face which is approximately vertical to the first face 15a and the second face of the semiconductor layer 15. The resin layer 25 has four side surfaces, for example, formed as a rectangular shape, and one side surface thereof is the third face 25b.

In the same third face 25b, a side surface of a part of the n-side metal pillar 24 is exposed from the resin layer 25. The exposed face serves as the n-side outer terminal 24b for mounting to the mounting substrate in the outer portion.

Further, as shown in FIG. 19A, the side surface 21b of a part of the p-side interconnection layer 21 is exposed from the resin layer 25 in the third face 25b, and serves as the p-side outer terminal. In the same manner, the side surface 22b of a part of the n-side interconnection layer 22 is exposed from the resin layer 25 in the third face 25b, and serves as the n-side outer terminal.

In the p-side metal pillar 23, the portions other than the p-side outer terminal 23b which are exposed in the third face 25b are covered by the resin layer 25. Further, in the n-side metal pillar 24, the portions other than the n-side outer terminal 24b which are exposed in the third face 25b are covered by the resin layer 25.

Further, in the p-side interconnection layer 21, the portions other than the side surface 21b which are exposed in the third face 25b are covered by the resin layer 25. Further, in the n-side interconnection layer 22, the portions other than the side surface 22b which are exposed in the third face 25b are covered by the resin layer 25.

The semiconductor light emitting device 2 is mounted in such a manner in which the third face 25b is directed toward a mounting face 201 of the mounting substrate 200, as shown in FIG. 20. Each of the p-side outer terminal 23b and the n-side outer terminal 24b which are exposed in the third face 25b is bonded to a pad 202 which is formed in the mounting face 201 via a solder 203. A interconnection pattern is formed in the mounting face 201 of the mounting substrate 200, and the pad 202 is connected to the interconnection pattern.

The third face 25b is approximately vertical to the first face 15a which is a main emitting face of the light. Accordingly, while the third face 25b is directed toward the downward mounting face 201 side, the first face 15a is directed not toward the above the mounting face 201 but a transverse direction. In other words, the semiconductor light emitting device 2 is a so-called side view tie semiconductor light emitting device in which the light is discharged in the transverse direction in the case that the mounting face 201 is used as a horizontal face.

Figure 21B:
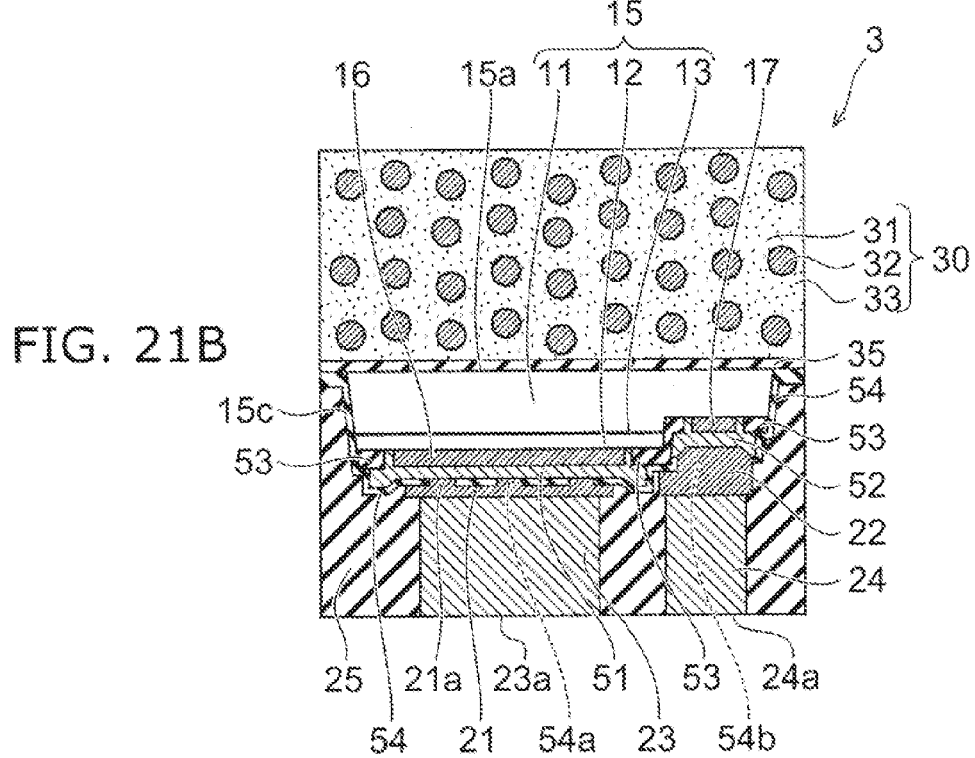

FIG. 21B is a schematic cross sectional view of a semiconductor light emitting device 3 according to the other variation of the embodiment.

In the semiconductor light emitting device 3, a p-side pad 51 which covers the p-side electrode 16 is provided on a surface and a side surface of the p-side electrode 16. The p-side electrode 16 includes, for example, at least one of a nickel (Ni), a gold (Au) and a rhodium (Rh) which can form an alloy with the gallium (Ga) included in the semiconductor layer 15. The p-side pad 51 has a higher reflectance with respect to the light emitting light of the active layer 13 than the p-side electrode 16, and includes, for example, the silver (Ag)

as a main component. Further, the p-side pad 51 protects the p-side electrode 16 from an oxidation and a corrosion.

Further, an n-side pad 52 which covers the n-side electrode 17 is provided on a surface and a side surface of the n-side electrode 17. The n-side electrode 17 includes, for example, at least one of the nickel (Ni), the gold (Au) and the rhodium (Rh) which can form the alloy with the gallium (Ga) included in the semiconductor layer 15. The n-side pad 52 has a higher reflectance with respect to the light emitting light of the light emitting layer 13 than the n-side electrode 17, and includes, for example, the silver (Ag) as a main component. Further, the n-side pad 52 protects the n-side electrode 17 from an oxidation and a corrosion.

An insulating film 53, for example, a silicon oxide film, a silicon nitride film or the like is provided in a periphery of the p-side electrode 16 and a periphery of the n-side electrode 17 in the second face in the semiconductor layer 15. The insulating film 53 is provided between the p-side electrode 16 and the n-side electrode 17, and between the p-side pad 51 and the n-side pad 52.

An insulating film 54, for example, a silicon oxide film, a silicon nitride film or the like is provided on the insulating film 53, the p-side pad 51 and the n-side pad 52. Further, the insulating film 54 is provided on the side surface 15c of the semiconductor layer 15, and covers the side surface 15c.

The p-side interconnection layer 21 and the n-side interconnection layer 22 are provided on the insulating film 54. The p-side interconnection layer 21 is connected to the p-side pad 51 through a first opening 54a which is formed in the insulating film 54. The n-side interconnection layer 22 is connected to the n-side pad 52 through a second opening 54b which is formed in the insulating film 54.

In this configuration, the p-side interconnection layer 21 may be connected to the p-side pad 51 via a plurality of vias 21a as shown in FIG. 21B, or may be connected to the p-side pad 51 via one post in which a plane size is larger than the via 21a.

The p-side metal pillar 23 which is thicker than the p-side interconnection layer 21 is provided on the p-side interconnection layer 21. The n-side metal pillar 24 which is thicker than the n-side interconnection layer 22 is provided on the n-side interconnection layer 22.

The resin layer 25 is stacked with respect to the insulating film 54. The resin layer 25 covers the p-side interconnection portion which includes the p-side interconnection layer 21 and the p-side metal pillar 23, and the n-side interconnection portion which includes the n-side interconnection layer 22 and the n-side metal pillar 24. In this case, a face (a lower face in the drawing) on a side facing the p-side interconnection layer 21 in the p-side metal pillar 23 is exposed from the resin layer 25, and serves as the p-side outer terminal 23a. In the same manner, a face (a lower face in the drawing) on a side facing the n-side interconnection layer 22 in the n-side metal pillar 24 is exposed from the resin layer 25, and serves as the n-side outer terminal 24a.

Alternatively, the side surface of the p-side metal pillar 23 and the side surface of the n-side metal pillar 24 may be exposed, so as to be set to a side view type semiconductor light emitting device.

The resin layer 25 is filled into the above groove 80 which separates the semiconductor layer 15 into a plurality of sections on the substrate 10, via the insulating film 54. Accordingly, the side surface 15c of the semiconductor layer 15 is covered and protected by the insulating film 54 which is the inorganic film, and the resin layer 25.

In this case, in the embodiment mentioned above, the p-side interconnection layer 21 and the n-side interconnection layer 22 may be bonded to the pad of the mounting substrate, without providing the p-side metal pillar 23 and the n-side metal pillar 24.

Further, the p-side interconnection layer 21 and the p-side metal pillar 23 are not limited to be the separate bodies, but the p-side interconnection portion may be configured by integrally providing the p-side interconnection layer 21 and the p-side metal pillar 23 in the same process. In the same manner, the n-side interconnection layer 22 and the n-side metal pillar 24 are not limited to be the separate bodies, but the n-side interconnection portion may be configured by integrally providing the n-side interconnection layer 22 and the n-side metal pillar 24 in the same process.

In accordance with the embodiments mentioned above, it becomes possible to achieve both the high efficiency of the semiconductor light emitting device and the uniformization of the chromaticity, and it becomes possible to obtain the semiconductor light emitting device which has a high efficiency and has no chromaticity unevenness, and therefore, it is appropriate, for example, for lighting.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device comprising:
   a light emitting element including a semiconductor layer, the semiconductor layer having a first face, a side surface continued from the first face, and an active layer configured to emit a light, a p-side electrode provided on the semiconductor layer, and an n-side electrode provided on the semiconductor layer;
   a p-side interconnection portion being electrically connected to the p-side electrode;
   an n-side interconnection portion being electrically connected to the n-side electrode;
   an insulating material disposed on the side surface of the semiconductor layer, a periphery of the p-side interconnection portion, and a periphery of the n-side interconnection portion, the insulating material blocking light emitted by the light emitting element;
   a phosphor layer disposed on the insulating material and the first face of the semiconductor layer, the phosphor layer comprising a transparent medium, phosphor dispersed in the transparent medium, and particles dispersed in the transparent medium, the phosphor, when excited by the light, emitting a fluorescence, the particles being of a magnitude of not more than 1/10 of a wavelength of the light and having a refractive index that is different from a refractive index of the transparent medium; and
   a fluorescent reflection film provided between the light emitting element and the phosphor layer, the fluorescent reflection film having a reflectance with respect to a wavelength of the fluorescence emitted by the phosphor that is greater than a reflectance with respect to the wavelength of the light, the fluorescent reflection film being in contact with a substantial portion of the first face of the semiconductor layer and a surface of the insulating material disposed on the side surface of the semiconductor layer.

2. The device according to claim 1, wherein an average grain diameter of the particles is not less than 15 nm and not more than 45 nm.

3. The device according to claim 1, wherein
the semiconductor layer includes a second face opposite to the first face,
the p-side electrode is provided on the second face in a region including the active layer, and
the n-side electrode is provided on the second face in a region not including the active layer.

4. The device according to claim 3,
wherein the insulating material includes a first insulating material provided on a side of the second face, and having a first opening communicating with the p-side electrode and a second opening communicating with the n-side electrode,
the p-side interconnection portion is provided on the first insulating material, and electrically connected to the p-side electrode through the first opening, and
the n-side interconnection portion is provided on the first insulating material, and electrically connected to the n-side electrode through the second opening.

5. The device according to claim 4, wherein the first insulating material is disposed on the side surface continued from the first face of the semiconductor layer.

6. The device according to claim 4, wherein the insulating material includes a second insulating material provided between the p-side interconnection portion and the n-side interconnection portion.

7. The device according to claim 6, wherein the second insulating material is disposed on the periphery of the p-side interconnection portion and the periphery of the n-side interconnection portion.

8. The device according to claim 4, wherein the p-side interconnection portion includes:
a p-side interconnection layer provided inside the first opening and on the first insulating material; and
a p-side metal pillar provided on the p-side interconnection layer and being thicker than the p-side interconnection layer, and
the n-side interconnection portion includes:
an n-side interconnection layer provided inside the second opening and on the first insulating material; and
an n-side metal pillar provided on the n-side interconnection layer and being thicker than the n-side interconnection layer.

9. The device according to claim 1, wherein the transparent medium is a resin layer.

10. The device according to claim 1, wherein the fluorescent reflection film is a silicon nitride film.

11. The device according to claim 1, further comprising a top coat film provided on the phosphor layer.

12. The device according to claim 11, wherein the top coat film is a silicon nitride film.

13. The device according to claim 11, wherein the top coat film is a silicon oxide film.

14. The device according to claim 11, wherein the top coat film is a LiF film.

15. The device according to claim 11, wherein the top coat film has a refractive index between a refractive index of the transparent medium of the phosphor layer and a refractive index of an air.

16. The device according to claim 11, wherein
the transparent medium of the phosphor layer is a resin layer, and
the top coat film has a lower adhesion than a adhesion of the resin layer.

17. The device according to claim 11, wherein a grain diameter of the particles is $\lambda/10\,n$ in the case in which the wavelength of the light of the light emitting element is set to $\lambda$ and a refractive index of the transparent medium of the phosphor layer is set to n.

18. A semiconductor light emitting device, comprising:
a light emitting element including a semiconductor layer, the semiconductor layer having a first face, a side surface continued from the first face, and an active layer configured to emit a first light;
an insulating material covering the side surface of the semiconductor layer;
a phosphor layer disposed on the light emitting element, the phosphor layer comprising a transparent medium, phosphor dispersed in the transparent medium, and particles dispersed in the transparent medium, the phosphor, when excited by the first light, emitting a fluorescence, the particles being of a magnitude of not more than $1/10$ of a wavelength of the first light and having a refractive index that is different from a refractive index of the transparent medium; and
a fluorescent reflection film provided as a continuous layer between the light emitting element and the phosphor layer, the fluorescent reflection film having a reflectance with respect to a wavelength of the fluorescence emitted by the phosphor that is greater than a reflectance with respect to the wavelength of the first light.

19. The device according to claim 18, wherein the fluorescent reflection film is a planar film directly contacting the first face of the semiconductor layer.

20. The device according to claim 18, wherein the fluorescent reflection film is directly contacting a surface of the insulating material covering the side surface of the semiconductor layer.

* * * * *